US 6,600,690 B1

(12) United States Patent
Nahas et al.

(10) Patent No.: US 6,600,690 B1
(45) Date of Patent: Jul. 29, 2003

(54) SENSE AMPLIFIER FOR A MEMORY HAVING AT LEAST TWO DISTINCT RESISTANCE STATES

(75) Inventors: Joseph J. Nahas, Austin, TX (US); Thomas W. Andre, Austin, TX (US); Bradley J. Garni, Austin, TX (US); Chitra K. Subramanian, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/184,784

(22) Filed: Jun. 28, 2002

(51) Int. Cl.[7] .............................. G11C 7/02; G11C 11/00
(52) U.S. Cl. ....................................... 365/210; 365/158
(58) Field of Search ................................ 365/100, 148, 365/158, 185.2, 185.21, 210

(56) References Cited

U.S. PATENT DOCUMENTS

| | | | | |
|---|---|---|---|---|
| 5,631,865 A | * | 5/1997 | Iwase et al. ................. | 365/207 |
| 5,638,332 A | * | 6/1997 | Gaultier et al. ............. | 365/207 |
| 5,715,204 A | * | 2/1998 | Barcella ....................... | 365/207 |
| 5,898,617 A | * | 4/1999 | Bushey et al. ............... | 365/210 |
| 5,917,753 A | * | 6/1999 | Dallabora et al. ........... | 365/207 |
| 6,009,032 A | * | 12/1999 | Lin et al. ..................... | 365/207 |
| 6,094,394 A | * | 7/2000 | La Rosa ....................... | 365/207 |
| 6,396,757 B1 | * | 5/2002 | Quader et al. ............ | 365/185.21 |
| 6,538,940 B1 | * | 3/2003 | Nahas et al. ................ | 365/210 |

* cited by examiner

Primary Examiner—Trong Phan
(74) Attorney, Agent, or Firm—Robert L. King; James L. Clingan, Jr.

(57) ABSTRACT

In a memory, a sensing system detects bit states using one data and two reference inputs, to sense a difference in conductance of a selected memory bit cell and a midpoint reference conductance. Reference conductance is generated as the average conductance of a memory cell in the high conductance state and a memory cell in the low conductance state. The data input is coupled to the selected memory bit cell. The two reference inputs are respectively coupled to memory cells in high and low conductance memory states. The sense amplifiers use either current biasing or voltage biasing to apply a sensing voltage within a predetermined voltage range across the bit cells. Capacitance coupled to complementary outputs of the sense amplifiers is balanced by the circuit designs. In one form, the two reference inputs are internally connected. One of several gain stages amplifies the sense amplifier output without injecting parasitic errors.

49 Claims, 9 Drawing Sheets

SENSE AMPLIFIER FOR A MEMORY HAVING AT LEAST TWO DISTINCT RESISTANCE STATES

FIELD OF THE INVENTION

This invention relates to Magnetoresistive Random Access Memories (MRAMs) and other memories where the memory bit has at least two distinct resistance states, and more particularly to sense amplifier circuits for such memories.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, other types of nonvolatile memories are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

The resistance of the tunnel junction (TJ) changes value depending on the state of polarization of the magnetic layers above and below the tunnel junction. The resistance changes from a lower resistance value when the magnetic fields are aligned in the same direction to a higher resistance value when they are aligned in opposite directions. The value change may be on the order of thirty percent. Therefore, for a low resistance value of 10K ohms, the high resistance value could be about 13K ohms. A sense amplifier for an MRAM needs to detect this difference in value. Since the nominal value of the resistance has variation due to processing, it is useful to detect the state of a bit by comparing the resistance of the TJ in a bit to a nearby midpoint reference that may be formed as a midpoint of a reference bit in the high state and a reference bit in the low state. It is also important to maintain symmetry to balance the loading from the parasitic resistance and capacitance of the bit lines and the column multiplexing. In U.S. Pat. No. 6,269,040 entitled "Interconnection network for connecting memory cells to Sense Amplifiers" by Reohr et al., a resistance of a cell is compared to that of an average resistance between a high and a low reference. In the Reohr et al. circuit, the loading is almost but not fully balanced by sharing reference from two different subarrays to form the midpoint reference. Unfortunately, this solution also requires two sense amplifiers to implement. In addition, for memory arrays that require significant current to charge the bit line capacitance relative to the steady state current signals, such as in an MRAM, a significant percentage of the sensing time may be consumed for bit line charging and equalization.

Most known sense amplifiers have output terminals that are very responsive to movement on the input nodes of the sense amplifier. This responsiveness causes swings on the output nodes as the input nodes are charged to their steady state levels. During swings in voltage, capacitive imbalance may dominate the transient signal, resulting in loss of differential signal and speed of operation.

MRAMs offer the promise of a universal memory that can be high speed and non-volatile. Realizing this promise requires further improvements in speed and memory area efficiency, especially in the sensing speed of stored data values.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

DETAILED DESCRIPTION OF THE INVENTION

Figure 1:
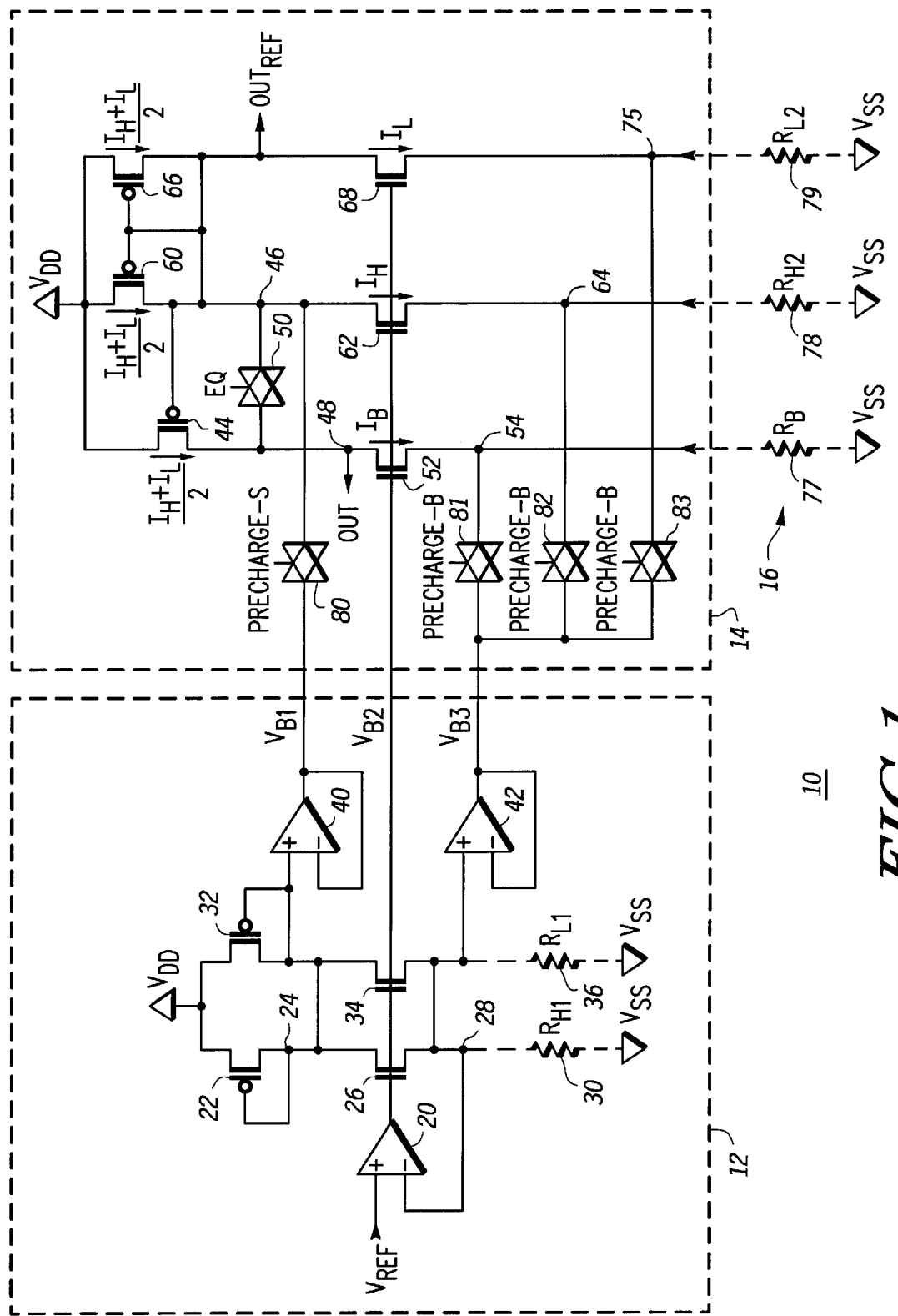
FIG. 1 is a schematic diagram of a sense amplifier with a bias circuit.

Illustrated in FIG. 1 is a memory 10 generally having a voltage bias portion 12, a sense amplifier 14 and an array portion 16. The voltage bias portion 12 has a P-channel transistor 22 having a first current electrode or a source connected to a power supply voltage terminal $V_{DD}$. A control electrode or gate of transistor 22 is connected to a second current electrode or a drain thereof at a node 24. An N-channel transistor 26 has a drain connected to the drain of transistor 22, a gate connected to the output of an operational amplifier 20, and a source connected to a node 28. Operational amplifier 20 has a first or positive (non-inverting) input connected to a reference voltage $V_{REF}$. A second or negative (inverting) input of operational amplifier 20 is connected to node 28. A first terminal of a resistor 30 is coupled to node 28. Resistor 30 has a resistance of value $R_{H1}$. A second terminal of resistor is coupled to a $V_{SS}$ reference voltage terminal. A P-channel transistor 32 has a source connected to the $V_{DD}$ terminal, and a gate and a drain connected together and to node 24. An N-channel transistor 34 has a drain connected to node 24, a gate connected to the output of operational amplifier 20, and a source coupled to a first terminal of a resistor 36. Resistor 36 has a resistance of value $R_{L1}$. A second terminal of resistor 36 is coupled to the $V_{SS}$ terminal. The connection to resistor 30 and resistor 36 may include coupling devices (not shown) to match the connections of the array resistors 77–79 to be described below. An operational amplifier 40 has a positive input connected to the gate and drain of transistor 32, a negative input connected to an output thereof for providing a sense precharge voltage, $V_{B1}$. An operational amplifier 42 has a positive input connected to the source of transistor 34, and a negative input connected to an output thereof for providing a bit precharge voltage, $V_{B3}$. The output of operational amplifier 20 provides a common gate bias voltage, $V_{B2}$.

In the sense amplifier 14, a P-channel transistor 44 has a source connected to the $V_{DD}$ voltage terminal. A drain of transistor 44 is connected to a drain of an N-channel transistor 52 at an output node 48. A gate of transistor 52 is connected to the $V_{B2}$ bias voltage. A source of transistor 52 is connected to a node 54 and coupled via one or more coupling devices (not shown) to a first terminal of a bit resistance 77 having a resistance of $R_B$. A second terminal of bit resistance 77 is coupled via one or more coupling devices (not shown) to the $V_{SS}$ voltage terminal. A P-channel transistor 60 has a source connected to the $V_{DD}$ voltage terminal, and a gate connected to a drain thereof and to a gate of transistor 44. A switch 50 has a first terminal connected to the drain of transistor 44 and a second terminal connected to the drain of transistor 60 at node 46. Switch 50 is controlled by an Equalization control signal, EQ. A drain of an N-channel transistor 62 is connected to node 46. Transistor 62 has a gate connected to the 6 $V_{B2}$ bias voltage and has a source connected to a node 64. A first terminal of a high reference resistance 78, $R_{H2}$, is coupled via one or more coupling devices (not shown) to node 64. A second terminal of resistance 78 is coupled via one or more coupling devices (not shown) to the $V_{SS}$ voltage terminal. A P-channel transistor 66 has a source connected to the $V_{DD}$ voltage terminal. A gate of transistor 66 is connected to a drain thereof at node 46 and to the gate of transistor 60. Node 46 forms a reference output terminal, $OUT_{REF}$. A drain of an N-channel transistor 68 is connected to node 46. Transistor 68 has a gate connected to the bias voltage, $V_{B2}$. A source of transistor 68 is connected to node 75 and coupled via one or more coupling devices (not shown) to a first terminal of a low reference resistance 79, $R_{L2}$. A second terminal of resistance 79 is coupled via one or more coupling devices (not shown) to the $V_{SS}$ voltage terminal. A switch 80 has a first terminal connected to the output of operational amplifier 40. Switch 80 has a second terminal connected to node 46, and has a control terminal connected to a precharge control signal, PRECHARGE-S. A switch 81 has a first terminal connected to the output of operational amplifier 42, a second terminal connected to node 54 and a control terminal for receiving a precharge control signal, PRECHARGE-B. A switch 82 has a first terminal connected to the output of operational amplifier 42, a second terminal connected to node 64, and a control terminal for receiving the PRECHARGE-B signal. A switch 83 has a first terminal connected to the output of operational amplifier 42, a second terminal connected to node 75, and a control terminal for receiving the PRECHARGE-B signal.

In operation, sense amplifier 14 senses a state of a memory cell, represented by resistance 77, that is programmable to either a high state or a low state. A bit (B), a high reference (H) and a low reference (L) are accessed in sense amplifier 14 by an address and a decoder (not shown). For memories such as an MRAM, the high reference is a cell programmed to a distinct high resistance memory state, $R_{H2}$ as represented by resistance 78. Similarly, the low reference is a cell programmed to a distinct low resistance memory state, $R_{L2}$ as represented by resistance 79. The bit is an addressed cell whose memory state $R_B$ represented by resistance 77 could be either a high (represented by a high resistance state) or a low (represented by a low resistance state). It should be appreciated that pass transistors (not shown) may exist between each of transistors 52, 62 and 68 and the associated coupled memory cell so that the resistances 77, 78 and 79 each represent a cumulative resistance associated with accessing the associated memory cell. Similarly, pass transistors may exist between the resistances 77, 78 and 79 and the $V_{SS}$ voltage terminal.

Bias circuit 12 will generate three specific bias voltages to control sense amplifier 14. Sense amplifier 14 uses a common gate voltage, $V_{B2}$, to bias the transistors 52, 62 and 68. The biasing of transistors 52, 62 and 68 places a substantially same bias voltage across resistances $R_B$, $R_{H2}$ and $R_{L2}$ that is close to a transistor threshold below $V_{B2}$. This biasing establishes saturated current levels for each of transistors 52, 62 and 68 that is represented as $I_B$, $I_H$ and $I_L$. The values of $I_B$, $I_H$ and $I_L$ are close to the substantially same bias voltage placed across them divided by the total effective resistance associated with accessing $R_B$, $R_{H2}$ and $R_{L2}$. In the illustrated form, transistors 60 and 66 are connected in a manner that averages $I_H$ and $I_L$ thereby establishing a current through each of transistors 60 and 66 equal to $(I_H+I_L)/(2)$. The biasing of transistors 60 and 66 establishes a reference voltage $OUT_{REF}$ at node 46. Connecting the gate of transistor 44 at node 46 to the gates of transistors 60 and 66 establishes as a current mirror a saturated current level for transistor 44 that is also equal to $(I_H+I_L)/(2)$. The voltage at node 48, the output (OUT), will then reflect the difference between the saturated current $(I_H+I_L)/(2)$ conducted by transistor 44 and the saturated current $I_B$ conducted by transistor 52. For an $R_B$ with a low resistance state, the steady state voltage value of the Out signal at node 48 will be lower in potential than the reference voltage $OUT_{REF}$. For an $R_B$ with a high resistance state, the steady state voltage value of the Out signal at node 48 will be higher in potential than the reference voltage $OUT_{REF}$.

Use of precharge and equalization techniques enhances the speed of sense amplifier 14. By using precharge switches 80–83 in conjunction with equalization switch 50, the time required to charge capacitance associated with nodes 54, 64, 75, 48 and 46 is significantly reduced. By maintaining equalization switch 50 conductive after precharge switch 80 is made nonconductive by the PRECHARGE-S signal, nodes 46 and 48 are held at equal potential to reach their steady state potentials and diminish the effect of capacitive imbalances associated with the circuitry.

Voltage bias portion 12 receives a reference input voltage, $V_{REF}$, and uses $R_{H1}$ and $R_{L1}$ to provide precharge and bias voltages to sense amplifier 14. In operation, $V_{B2}$ is controlled by operational amplifier 20 to maintain a voltage equal to the Vref input voltage on node 28. Two reference memory cells, $R_{H1}$ and $R_{L1}$, are coupled to node 28. The $R_{H1}$ resistance is a memory cell having a high resistance state and the $R_{L1}$ resistance is a memory cell having a low resistance state. The connection of $R_{H1}$ and $R_{L1}$ with the inverting input of operational amplifier 20 along with transistors 26 and 34 being sized substantially equal to the size of transistors 52, 62 and 68 results in the establishment of a voltage $V_{B2}$ that creates steady state voltages in sense amplifier 14 that are substantially equal to the $V_{REF}$ value. In particular, the steady state voltages are the voltages at nodes 54, 64 and 75.

The voltage $V_{B3}$ provided by operational amplifier 42 is used to precharge nodes 54, 64 and 75 to a value close to their steady state values. By using transistors 22 and 32 substantially of the same size as transistors 44, 60 and 66, operational amplifier 40 provides a voltage $V_{B1}$ that is used to precharge nodes 48 and 46 in sense amplifier 14 to a value close to their steady state value.

Bias portion 12 is designed to adjust the voltages $V_{B1}$, $V_{B2}$ and $V_{B3}$ over temperature, supply voltage, and process variations. The tracking in voltage values between bias portion 12 and sense amplifier 14 is in part due to the intentional device size matching of transistors in voltage bias portion 12 with transistors in sense amplifier 14 and use of reference resistances $R_{H1}$ and $R_{L1}$.

Figure 2:
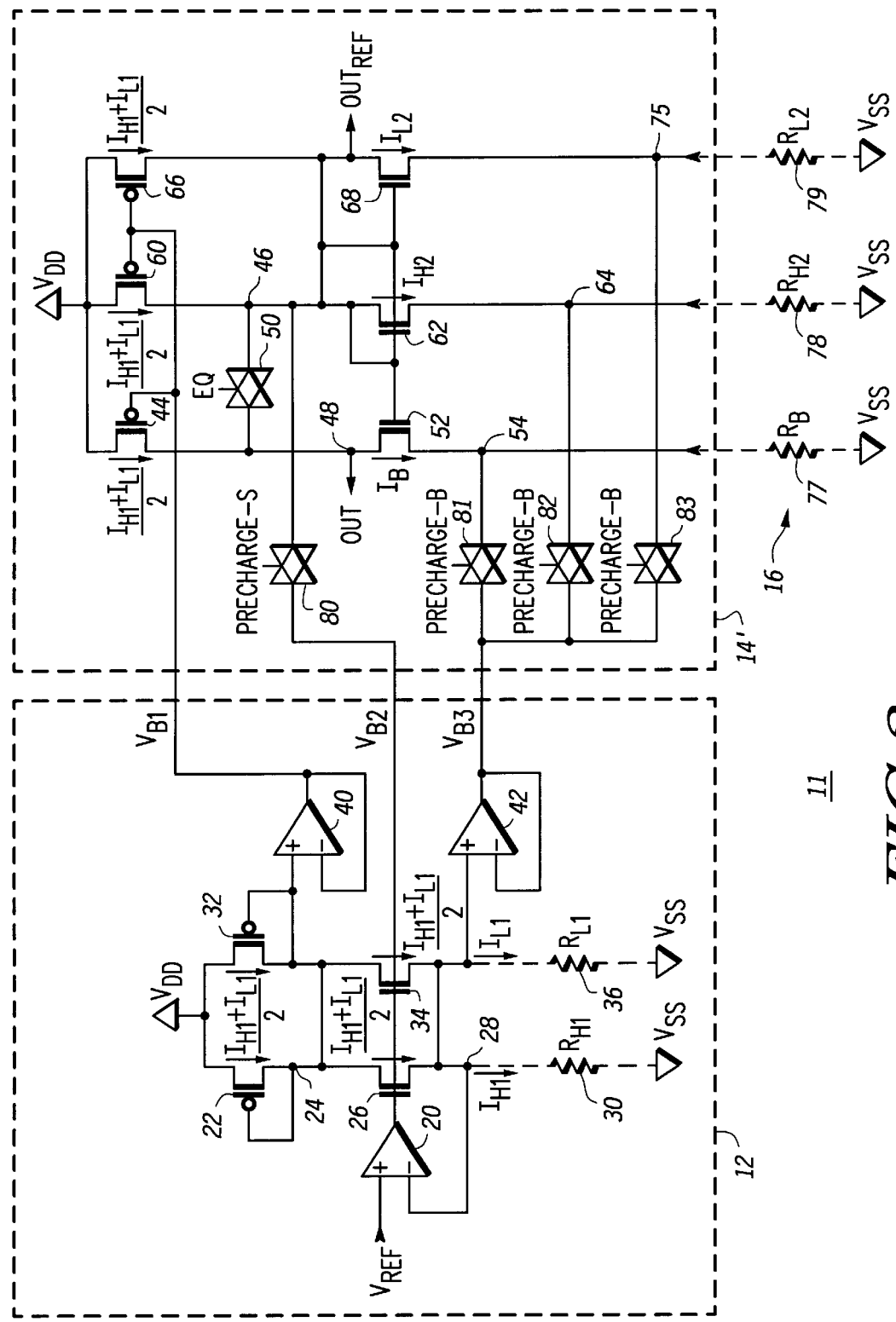
FIG. 2 is a schematic diagram of another sense amplifier with a bias circuit.

Illustrated in FIG. 2 is a memory 11 that is a variation of memory 10. For convenience of illustration, the same reference numbers will be used to the same elements commonly illustrated between the figures described herein. Memory 11 differs from memory 10 in that the output of operational amplifier 40 now provides a bias voltage for mirroring current, $V_{B1}$, that is connected to the gates of P-channel transistors 44, 60 and 66. The gates of transistors 44, 60 and 66 are no longer connected to node 46. The output of operational amplifier 20 now provides a sense precharge voltage, $V_{B2}$ that is connected to the first terminal of switch 80. The gate of transistor 52 is now connected only to the gates of transistors 62 and 68 and to the drain of transistor 62 at node 46. In other words, the gates of transistors 52, 62 and 68 have been disconnected from voltage $V_{B2}$ and connected to node 46.

In operation, sense amplifier 14' senses a state of a memory cell represented by resistance 77 that is programmable to either a high state or a low state. Voltage $V_{B1}$ is provided in the same manner as voltage $V_{B1}$ of FIG. 1 by bias circuit portion 12. Voltage $V_{B2}$ is also provided in the same manner as $V_{B2}$ in FIG. 1, and $V_{B3}$ is provided in the same manner as in FIG. 1. Voltage $V_{B1}$ sets up a common saturated current level for transistors 44, 60 and 66 shown as $(I_{H1}+I_{L1})/(2)$. The current $(I_{H1}+I_{L1})/(2)$ conducted by each of transistors 60 and 66 is summed at node 46 and distributed through transistors 62 and 68 to provide $I_{H2}$ and $I_{L2}$ to resistances 78 and 79, respectively. Currents $I_{H2}$ and $I_{L2}$ bias resistances 78 and 79, respectively, in a manner that provides substantially equal voltages at nodes 64 and 75, respectively. Transistors 62 and 68 are connected in a manner that provides a voltage at node 46, $OUT_{REF}$, that is approximately one transistor threshold above the similar voltage at nodes 64 and 75, respectively. The voltage at node 46 applied to the gate of transistor 52 provides a voltage at node 54 that is similar to the voltage at nodes 64 and 75. A saturated current level, $I_B$, is established for transistor 52. The current $I_B$ is substantially equal to the voltage at node 54 divided by the resistance of resistance 77. It should be noted that the bias $V_{B1}$ of P-channel transistors 44, 60 and 66 is being used to establish the magnitude of a substantially equal voltage at nodes 54, 64 and 75 as opposed to the $V_{B2}$ biasing of N-channel transistors 52, 62 and 68 of FIG. 1.

The voltage at node 48, the output (OUT), will then reflect the difference between the saturated current $(I_H+I_L)/(2)$ conducted by transistor 44 and the saturated current $I_B$ conducted by transistor 52. For an $R_B$ with a low resistance state, the steady state voltage value of the Out signal at node 48 will be lower in potential than the reference voltage $OUT_{REF}$. For an $R_B$ with a high resistance state, the steady state voltage value of the Out signal at node 48 will be higher in potential than the reference voltage $OUT_{REF}$.

The operation of the precharge and equalization function of memory 11 is analogous to that described above in connection with memory 10. Therefore, a redundant description will not be provided.

Figure 3:
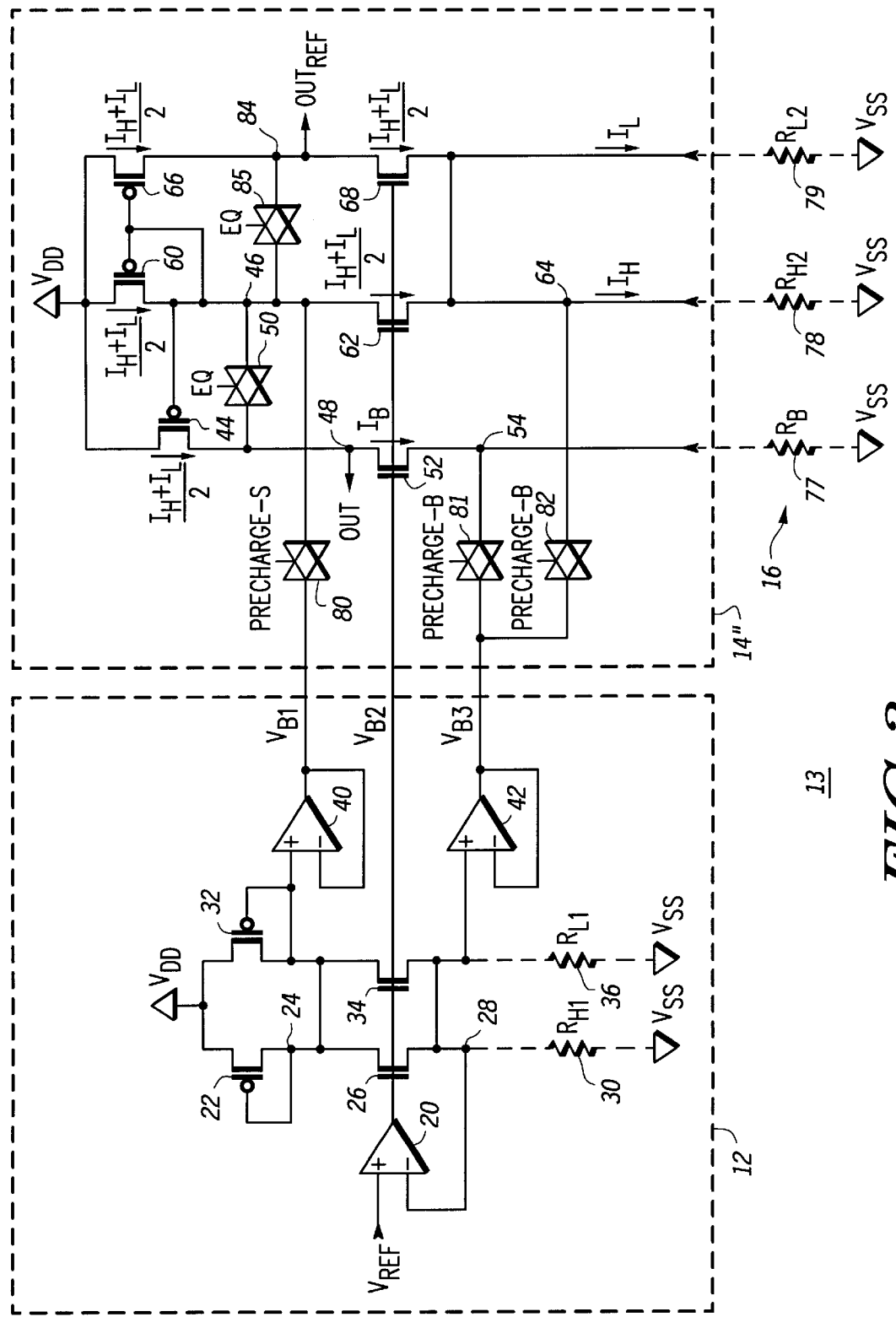
FIG. 3 is a schematic diagram of another sense amplifier with a bias circuit.

Illustrated in FIG. 3 is a memory 13 that is a variation of memory 10 of FIG. 1. For convenience of illustration, the same reference numbers will be applied to the same elements commonly illustrated between the figures described herein. Memory 13 differs from memory 10 in that the $OUT_{REF}$ output terminal is no longer provided at node 46, thus eliminating the gate capacitance associated with transistors 60 and 66 from being directly connected at the output terminal. The drains of transistors 66 and 68 are no longer connected to node 46 but to a node 84 which is the output terminal $OUT_{REF}$. An equalization switch 85 has a first terminal connected to node 46, and has a second terminal connected to the $OUT_{REF}$ output terminal at node 84. A control terminal of equalization switch 85 is connected to the Equalization (EQ) signal. Additionally, the sources of transistors 62 and 68 are directly connected at node 64 and node 75 is eliminated. Precharge switch 83 is also eliminated.

The operation of memory 13 is very analogous to the operation of memory 10 and similar features will not be repeated for purposes of brevity. While the equalization switches 50 and 85 are conductive, the steady state behavior of the sense amplifier 14" is substantially the same as sense amplifier 14 with equalization switch 50 conductive. After the Equalization signal (EQ) is made non-active, transistors 60 and 66 work in conjunction with transistors 62 and 68, respectively, and the connection between the sources of transistors 62 and 68 to maintain the averaging of currents $I_H$ and $I_L$ and bias transistors 60, 66, 62 and 68 all with an averaged current of $(I_H+I_L)/(2)$. In contrast, the current averaging in memory 10 of FIG. 1 is accomplished as described above in part by the connection of the drains of transistors 60 and 66. A benefit of memory 13 as compared with memory 10 is that the output nodes, OUT and $OUT_{REF}$, are designed to have the same total coupled capacitance. In this manner, the output node voltages will track similarly when common current offsets are applied to the inputs. The operation of the precharge and equalization function of memory 13 is analogous to that described above in connection with memory 10. Therefore, a redundant description will not be provided.

Figure 4:
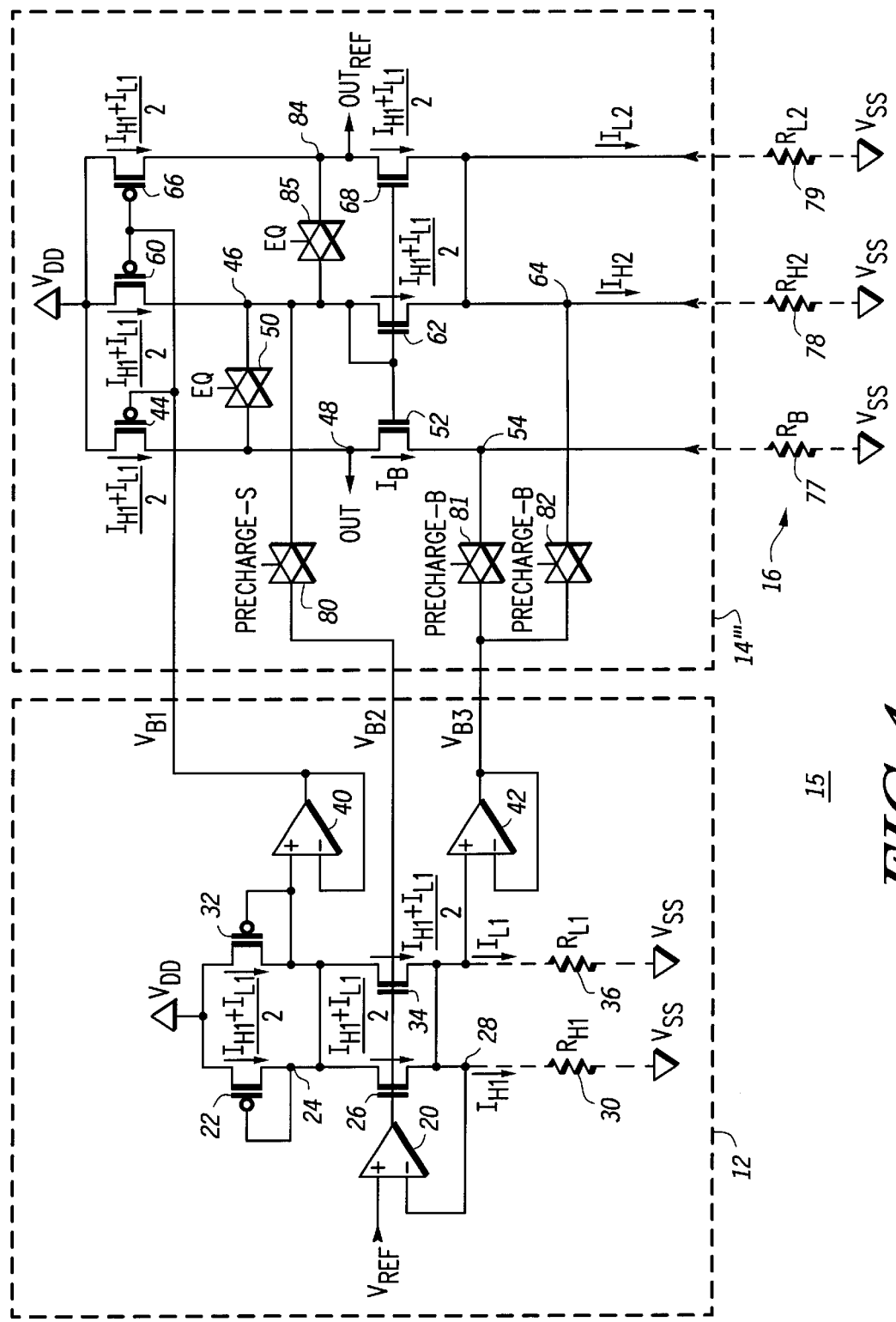
FIG. 4 is a schematic diagram of another sense amplifier with a bias circuit.

Illustrated in FIG. 4 is a memory 15 that is a variation of memory 11 of FIG. 2. For convenience of illustration, the same reference numbers will be applied to the same elements commonly illustrated between the figures described herein. Memory 15 differs from memory 11 in that the $OUT_{REF}$ output terminal is no longer provided at node 46 thus eliminating the gate capacitance associated with transistors 62 and 68 from being directly connected at the output terminal. The drains of transistors 66 and 68 are no longer connected to node 46 but to a node 84 which is the output terminal, $OUT_{REF}$. An equalization switch 85 has a first terminal connected to node 46, and has a second terminal connected to the $OUT_{REF}$ output terminal at node 84. A control terminal of equalization switch 85 is connected to the Equalization (EQ) signal. Additionally, the sources of transistors 62 and 68 are directly connected at node 64 and node 75 is eliminated. Precharge switch 83 is also eliminated.

The operation of memory 15 is very analogous to the operation of memory 11 and similar features will not be repeated for purposes of brevity. Whereas in FIG. 2 the drains of transistors 62 and 68 are electrically short circuited together and the sources of transistors 62 and 68 are isolated, in FIG. 4 transistors 62 and 68 have the sources thereof electrically short circuited and have isolated drains. In both memory 11 and memory 15, the voltage at node 46 is established in a similar manner and applied to the gate of transistor 52. Memory 15 shares the same benefit as compared with 11 as memory 13 had over memory 10. That benefit is that the output nodes, OUT and OUT$_{REF}$, are designed to have the same total coupled capacitance. In this manner, the output node voltages will track similarly when common current offsets are applied to the inputs. The operation of the precharge and equalization function of memory 15 is analogous to that described above in connection with memory 10. Therefore, a redundant description will not be provided.

Figure 5:
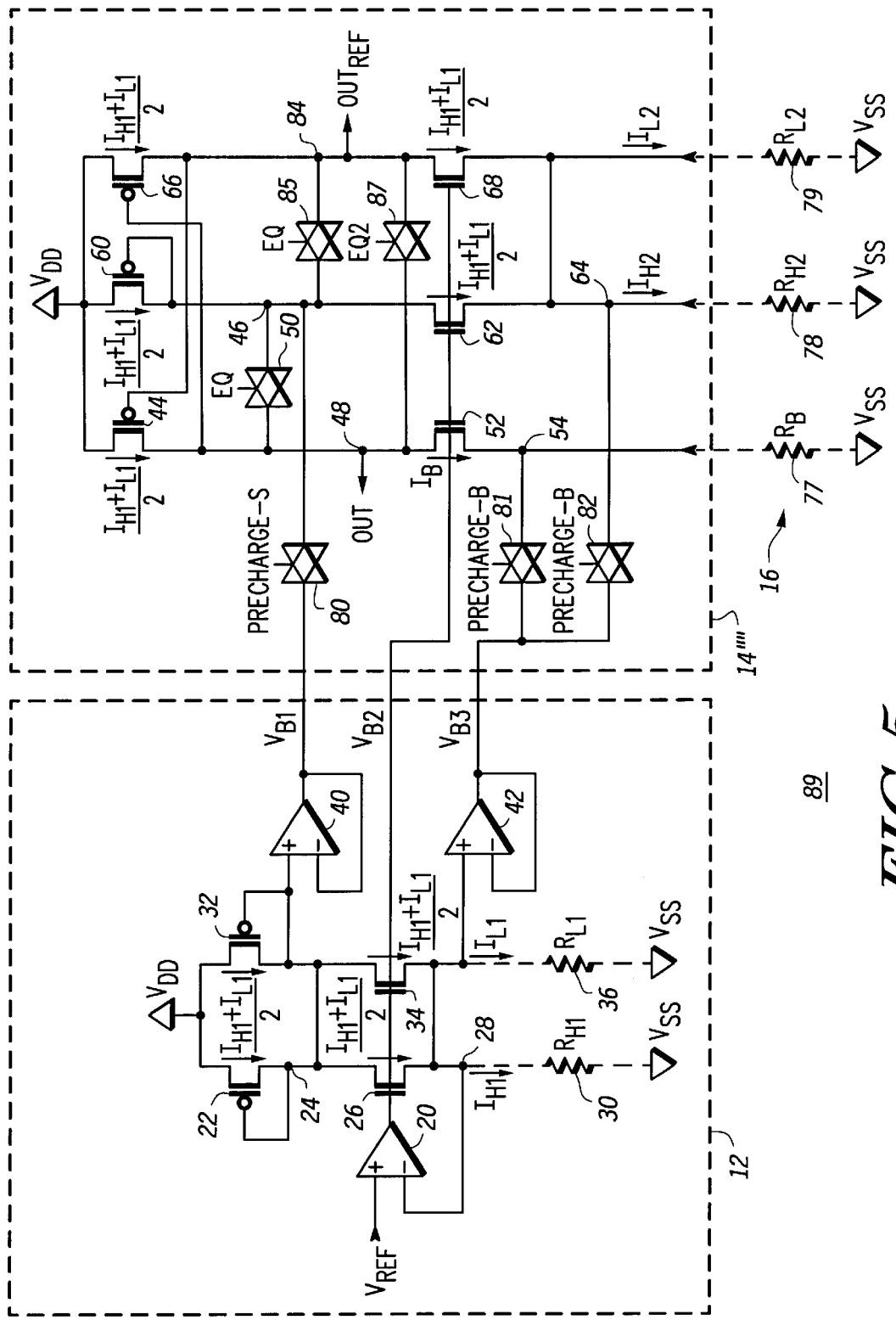
FIG. 5 is a schematic diagram of another sense amplifier with a bias circuit.

Illustrated in FIG. 5 is a memory 89 that is a variation of memory 13 of FIG. 3. For convenience of illustration, the same reference numbers will be applied to the same elements commonly illustrated between the figures described herein. Memory 89 differs from memory 13 in that the gate of transistor 44 is now connected to node 84, and the gate of transistor 66 is connected to node 48. In contrast, in memory 13 the gates of both transistors 44 and 66 are connected to the gate of transistor 60 at node 46. Additionally, equalization switch 87 is added to memory 89. A first terminal of equalization switch 87 is connected to the output (OUT) node 48, and a second terminal of equalization switch 87 is connected to the output (OUT$_{REF}$) node 84. A control terminal of equalization switch 87 is connected to the Equalization signal (EQ2).

The operation of memory 89 is very analogous to the'operation of memory 13 and similar features will not be repeated for purposes of brevity. In operation, while equalization switches 50 and 85 are conductive, the steady state behavior of sense amplifier 14'''' is substantially the same as the steady state behavior of sense amplifier 14'' of FIG. 3. Upon making EQ and EQ2 non-asserted, the output terminal OUT at node 48 moves to a voltage in a similar manner as described for memory 13 of FIG. 3 in response to the difference between I$_B$ and (I$_{H1}$+I$_{L1}$)/(2). In one form, the signal EQ2 may remain asserted for a brief period longer than signal EQ to reduce the influence of any capacitive imbalance between switch 50 and switch 85. In response to movement on node 48, the cross coupling of node 48 to the gate of transistor 66 causes the output voltage, OUT$_{REF}$, at node 84 to move in the opposite direction from node 48. Feedback from node 84 to the gate of transistor 44 adds further amplification to the movement in nodes 48 and 84. The operation of the precharge function of memory 89 is analogous to that described above in connection with memory 10. Therefore, a redundant description will not be provided.

Figure 6:
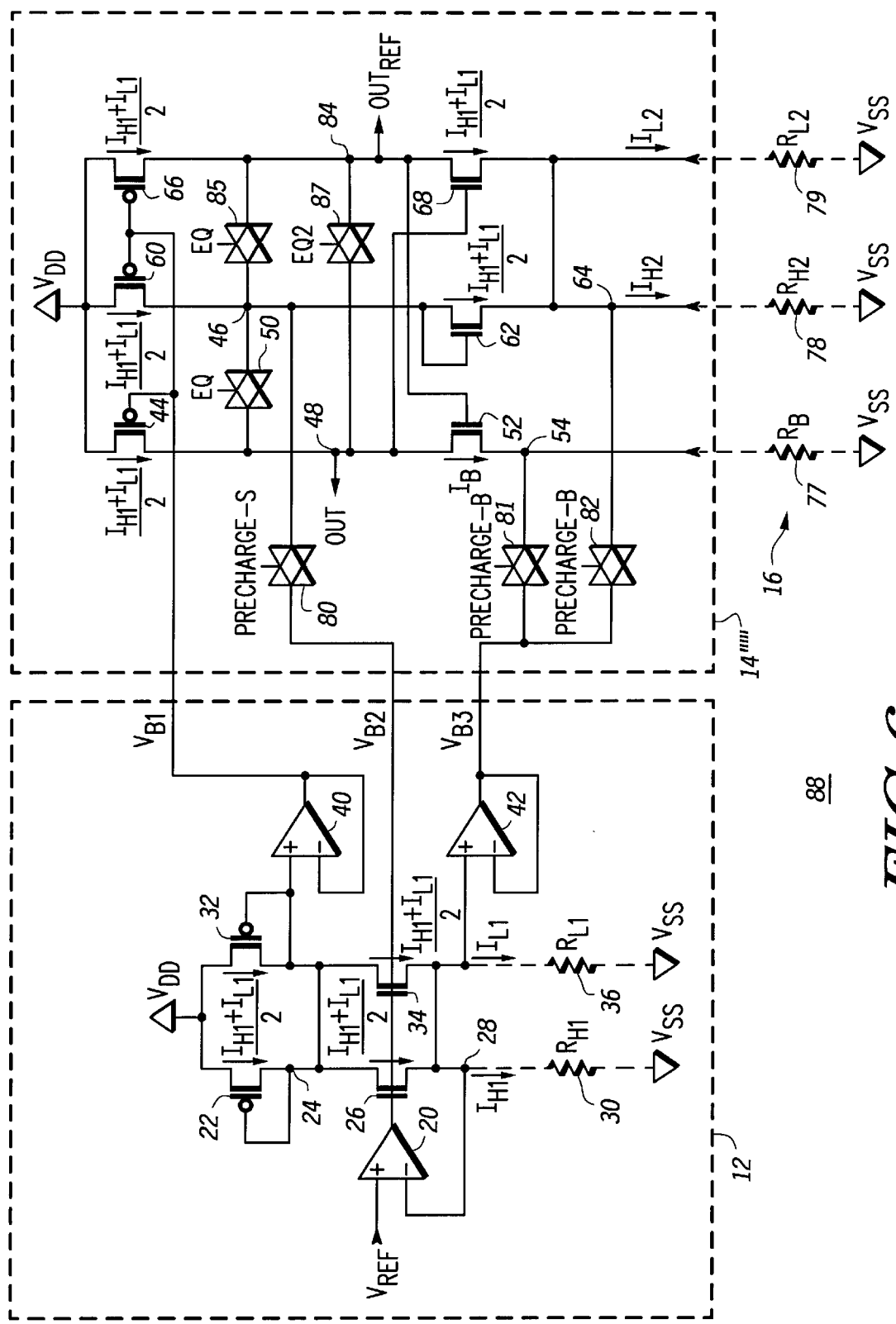
FIG. 6 is a schematic diagram of yet another sense amplifier with a bias circuit.

Illustrated in FIG. 6 is a memory 88 that is analogous to memory 15 of FIG. 4. For convenience of illustration, the same reference numbers will be applied to the same elements commonly illustrated between the figures described herein. Memory 88 differs from memory 15 in that the gate of transistor 52 is now connected to node 84, and the gate of transistor 68 is connected to node 48. In contrast, in memory 15 the gates of both transistors 52 and 68 are connected to the gate of transistor 62 at node 46. Additionally, equalization switch 87 is added to memory 88. A first terminal of equalization switch 87 is connected to the output (OUT) node 48, and a second terminal of equalization switch 87 is connected to the output (OUT$_{REF}$) node 84. A control terminal of equalization switch 87 is connected to the Equalization signal (EQ2).

The operation of memory 88 is very analogous to the operation of memory 15 and similar features will not be repeated for purposes of brevity. In operation, while equalization switches 50 and 85 are conductive, the steady state behavior of sense amplifier 14'''' is substantially the same as the steady state behavior of sense amplifier 14''' of FIG. 4. Upon making EQ and EQ2 non-asserted, the output terminal OUT at node 48 moves to a voltage in a similar manner as described for memory 15 of FIG. 4 in response 10 to the difference between I$_B$ and (I$_{H1}$+I$_{L1}$)/(2). In one form, the signal EQ2 may remain asserted for a brief period longer than signal EQ to reduce the influence of any capacitive imbalance between switch 50 and switch 85. In response to movement on node 48, the cross coupling of node 48 to the gate of transistor 68 causes the output voltage, OUT$_{REF}$, at node 84 to move in the opposite direction from node 48. Feedback from node 84 to the gate of transistor 52 adds further amplification to the movement in nodes 48 and 84. The operation of the precharge function of memory 88 is analogous to that described above in connection with memory 10. Therefore, a redundant description will not be provided.

Figure 7:
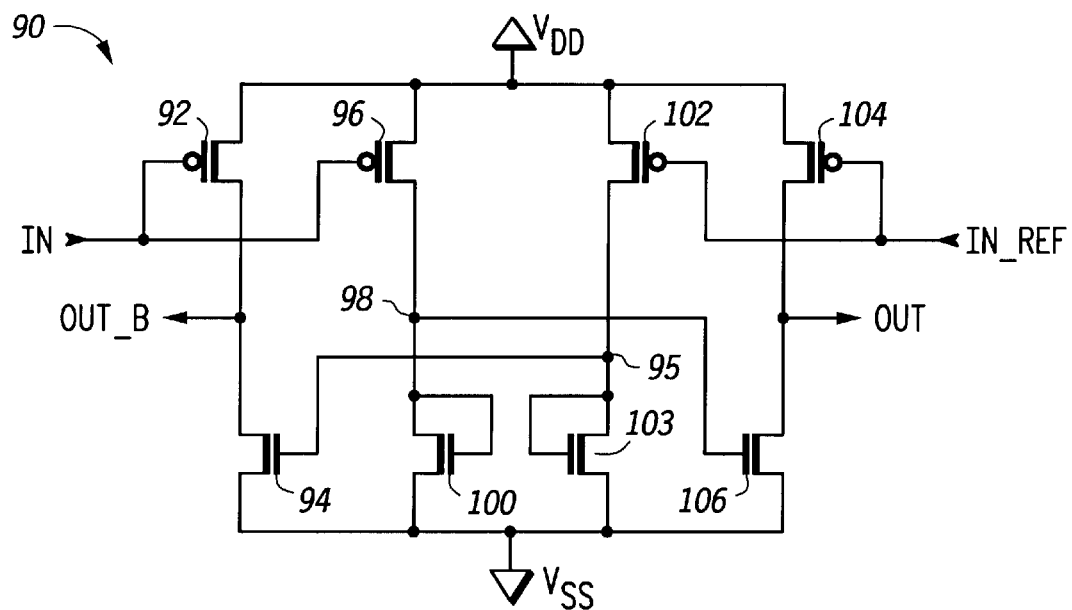
FIG. 7 is a schematic diagram of a gain stage associated with a sense amplifier for use with any of the illustrated sense amplifiers of FIGS. 1, 3 and 5.

Illustrated in FIG. 7 is a gain stage 90 that may be used in connection with any of the previously described sense amplifiers of FIGS. 1, 3 or 5. For example, the OUT signal of node 48 is connected to the IN input terminal that is connected to a gate of each of a P-channel transistor 92 and a P-channel transistor 96. The OUT$_{REF}$ signal of either node 46 (FIG. 1) or node 84 (FIGS. 3 or 5) is connected to the IN_REF input terminal that is connected to a gate of each of a P-channel transistor 102 and a P-channel transistor 104.

Transistor 92 has a source connected to the V$_{DD}$ supply voltage terminal, a gate for receiving the IN signal, and a drain connected to a drain of an N-channel transistor 94 at an output terminal, OUT-B. Transistor 94 has a gate connected to node 95 and a source connected to the V$_{SS}$ supply voltage terminal. Transistor 96 has a source connected to the V$_{DD}$ supply voltage terminal, a gate for receiving the IN signal, and a drain connected to a drain of an N-channel transistor 100 at a node 98. A gate of transistor 100 is connected to the drain thereof, and a source of transistor 100 is connected to the V$_{SS}$ supply voltage terminal. P-channel transistor 102 has a source connected to the V$_{DD}$ supply voltage terminal, a gate for receiving the IN_REF signal, and a drain connected to a drain of an N-channel transistor 103 at a node 95. The drain of transistor 103 is connected to a gate thereof. Transistor 103 has a source connected to the V$_{SS}$ supply voltage terminal. P-channel transistor 104 has a source connected to the V$_{DD}$ supply voltage terminal, a gate connected to the IN_REF signal, and a drain connected to the drain of an N-channel transistor 106 at an output terminal, OUT. A gate of transistor 106 is connected to node 98. A source of transistor 106 is connected to the V$_{SS}$ supply voltage terminal.

In operation, the voltage of the IN signal applied to the gates of transistors 92 and 96 creates a saturated current level for these two transistors that is proportional to [(V$_{DD}$−IN)+V$_{thp}$]$^2$ where V$_{thp}$ is the threshold voltage of a P-channel transistor such as transistor 92. Similarly, the voltage of the signal IN_REF applied to the gate of transistors 102 and 104 creates a saturated current level for these two transistors that is proportional to [(V$_{DD}$−IN_REF)+V$_{thp}$]$^2$. Transistors 96 and 100 form a first input stage of gain stage 90 that has an output at node 98. The current conducted by transistor 96 is mirrored by diode-configured transistor 100 to create a saturated current condition within transistor 106 equal to $[(V_{DD}-IN)+V_{thp}]^2$. Similarly, transistors 102 and 103 form a second input stage having an output at node 95. The current conducted by transistor 102 is mirrored by diode-configured transistor 103 to create a saturated current condition within transistor 94 equal to $[(V_{DD}1-IN\_REF)+V_{thp}]^2$. Transistors 92 and 94 form a first output stage and transistors 104 and 106 form a second output stage. In response to the saturated current condition of transistors 92 and 94, the output of the second output stage has a voltage at OUT_B that moves toward either a high or a low logic state. Similarly, in response to the saturated current condition of transistors 104 and 106, the output of the first output stage has a voltage at OUT that moves toward an opposite logic state to that of OUT_B. It should be noted that the amount of differential amplification of the input signals is dependent upon the sizes of all the transistors in gain stage 90 and the D.C. bias of the differential inputs IN and IN_REF.

Figure 8:
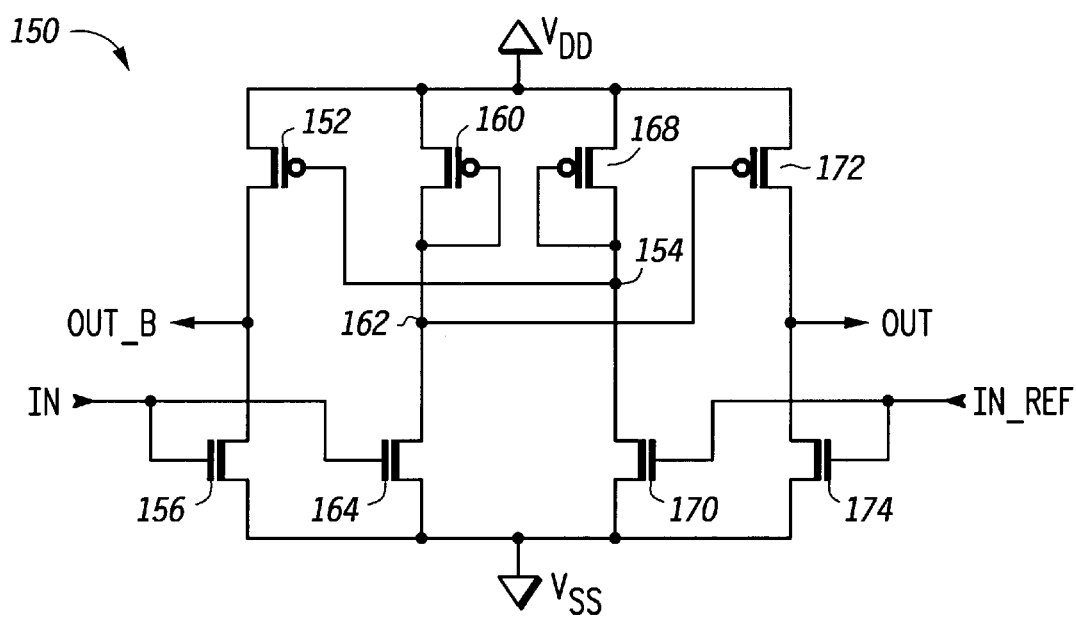
FIG. 8 is a schematic diagram of another gain stage associated with a sense amplifier for use with any of the illustrated sense amplifiers of FIGS. 2, 4 and 6.

Illustrated in FIG. 8 is a gain stage 150 that may be used in connection with the sense amplifiers of FIGS. 2, 4 or 6. An IN input signal is connected to a gate of an N-channel transistor 156 and to a gate of an N-channel transistor 164. An IN_REF signal is connected to gates of N-channel transistors 170 and 174. A P-channel transistor 152 has a source connected to a $V_{DD}$ supply voltage terminal, a gate connected to a node 154, and a drain connected to a drain of the N-channel transistor 156 at an output terminal, OUT_B. A gate of transistor 156 is connected to the input signal IN. A source of transistor 156 is connected to a $V_{SS}$ supply voltage terminal. A source of a P-channel transistor 160 is connected to the $V_{DD}$ supply voltage terminal. A gate of transistor 160 is connected to a drain thereof and connected at a node 162 to a drain of the N-channel transistor 164. A gate of transistor 164 is connected to the input IN signal. A source of transistor 164 is connected to the $V_{SS}$ supply voltage terminal. A source of a P-channel transistor 168 is connected to the $V_{SS}$ supply voltage terminal. A gate of transistor 168 is connected to a drain thereof and to a drain of the N-channel transistor 170 at node 154. The gate of transistor 170 is connected to the input IN_REF. Transistor 170 has a source connected to the $V_{SS}$ supply voltage terminal. A source of a P-channel transistor 172 is connected to the $V_{DD}$ supply voltage terminal. A gate of transistor 172 is connected to node 162. A drain of transistor 172 is connected to an output terminal, OUT and to a drain of the N-channel transistor 174. A gate of transistor 174 is connected to the input signal IN_REF. A source of transistor 174 is connected to the $V_{SS}$ supply voltage terminal.

In operation, the voltage of the IN signal applied to the gates of transistors 156 and 164 creates a saturated current level for these two transistors that is proportional to $[IN-V_{SS}-V_{thn}]^2$ where $V_{thn}$ is the threshold voltage of an N-channel transistor such as transistor 156. Similarly, the voltage of the signal IN_Ref applied to the gates of transistors 170 and 174 creates a saturated current level for these two transistors that is proportional to $[IN\_Ref-V_{SS}-V_{thn}]^2$. The current conducted by transistor 164 is mirrored by diode-configured transistor 160 to create a saturated current condition within transistor 172 equal to $[IN-V_{SS}-V_{thn}]^2$. Similarly, the current conducted by transistor 170 is mirrored by diode-configured transistor 168 to create a saturated current condition within transistor 152 equal to $[IN\_Ref-V_{SS}-V_{thn}]^2$. In response to the saturated current condition of transistors 152 and 156, the voltage at OUT_B moves toward either a high or a low logic state. Similarly, in response to the saturated current condition of transistors 172 and 174, the voltage at OUT moves toward an opposite logic state to that of OUT_B. It should be noted that the amount of differential amplification of the input signals is dependent upon the sizes of all the transistors in gain stage 150 and the D.C. bias of the differential inputs IN and IN_REF.

Figure 9:
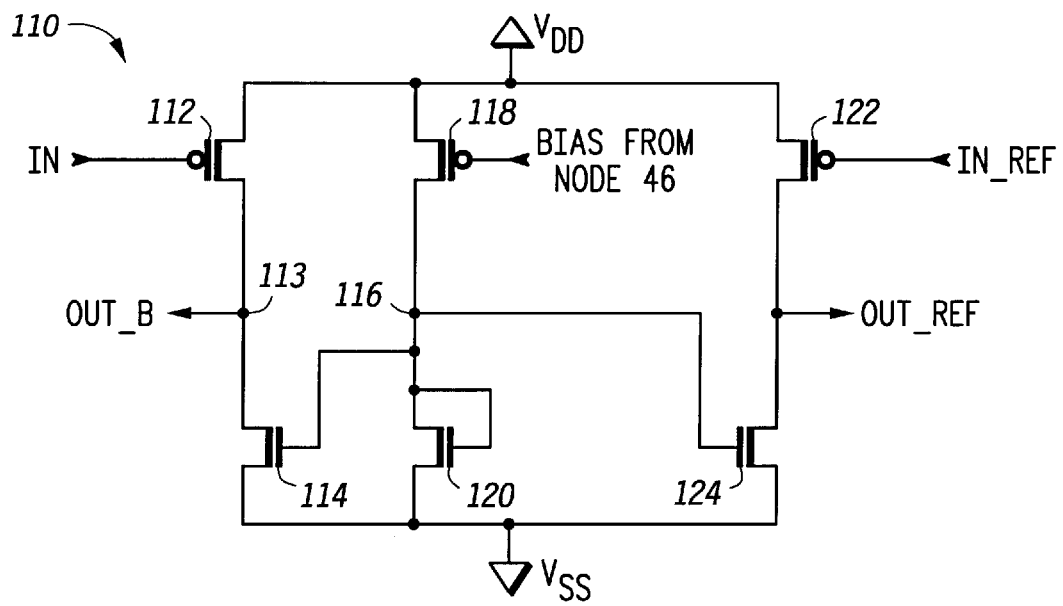
FIG. 9 is a schematic diagram of another gain stage of a sense amplifier for use with any of the illustrated sense amplifiers of FIGS. 1, 3 and 5.

Illustrated in FIG. 9 is a gain stage 110 for use with any of the previously described sense amplifiers of FIGS. 1, 3 or 5. A P-channel transistor 112 has a source connected to a $V_{DD}$ power supply terminal, a gate connected to an input signal, IN, and a drain connected at a node 113 that provides an output signal OUT_B to a drain of an N-channel transistor 114. Transistor 114 has a source connected to a $V_{SS}$ supply voltage terminal and a gate connected to node 116. A P-channel transistor 118 has a source connected to the $V_{DD}$ supply voltage terminal, a gate connected to receive a bias voltage from node 46 of sense amplifiers 1, 3 or 5, and a drain connected at a node 116 to the gate of transistor 114 and to a drain of an N-channel transistor 120. A gate of transistor 120 is connected to the drain thereof and a source connected to the $V_{SS}$ supply voltage terminal. A P-channel transistor 122 has a source connected to the $V_{DD}$ supply voltage terminal, a gate which receives the IN_REF signal, and a drain which provides the OUT_REF signal and is connected to a drain of an N-channel transistor 124. A gate of transistor 124 is connected to node 116. A source of transistor 124 is connected to the $V_{SS}$ supply voltage terminal.

In operation, the voltage of the IN signal applied to the gate of transistor 112 creates a saturated current level for this transistor that is proportional to $[(V_{DD}-IN)+V_{thp}]^2$ where $V_{thp}$ is the threshold voltage of an P-channel transistor such as transistor 112. The voltage of the IN_REF signal applied to the gate of transistor 122 creates a saturated current level for this transistor that is proportional to $[(V_{DD}-IN\_REF)+V_{thp}]^2$. Transistor 118 is biased by node 46 in a manner that creates a saturated current level for this transistor that is proportional to $[(V_{DD}-\text{Node }46\text{ bias})+V_{thp}]^2$. The current conducted by transistor 118 is mirrored by transistor 120 to create a saturated current level for transistors 114 and 124 equal to $[(V_{DD}\text{Node }46\text{ bias})+V_{thp}]^2$. The output at node 113 moves in a direction defined by a difference in the saturated current, $[(V_{DD}-IN)+V_{thp}]^2$, conducted by transistor 112 and the saturated current, $[(V_{DD}-\text{Node }46\text{ bias})+V_{thp}]^2$, conducted by transistor 114. By linking the bias voltage of transistor 118 to a voltage of one of sense amplifiers 1, 3 or 5, the steady state node 46 bias voltage is essentially equal to the steady state voltage IN_REF. Because of the equal bias voltages, the voltage provided at OUT_B will move in a positive direction if the bias voltage IN of transistor 112 is lower than the voltage IN_REF. Similarly, the voltage provided at OUT_B will move in a negative direction if the bias voltage IN of transistor 112 is higher than the voltage IN_REF.

The voltage at the output, $OUT_{REF}$, is defined by a difference in the saturated current, $[(V_{DD}-IN\_REF)+V_{thp}]^2$, conducted by transistor 122 and the saturated current, $[(V_{DD}-\text{Node }46\text{ bias})+V_{thp}]^2$, conducted by transistor 124. By linking the bias voltage of transistor 118 to a voltage of one of sense amplifiers 1, 3 or 5, the steady state node 46 bias voltage is essentially equal to the steady state voltage IN_REF. Because of the equal bias voltages, the saturated current conducted by transistor 122 is essentially equal to the saturated current conducted by transistor 124 and OUT_REF remains a static voltage reference. While the voltages are transitory in the sense amplifier, the bias voltage from node 46 may not be equal to IN_REF. During this period, nodes OUT_B and OUT_REF will respond in a similar manner to the difference between the voltage of node 46 and the voltage of the IN_REF input. The differential gain is therefore preserved during any time of transitory voltages.

Figure 10:
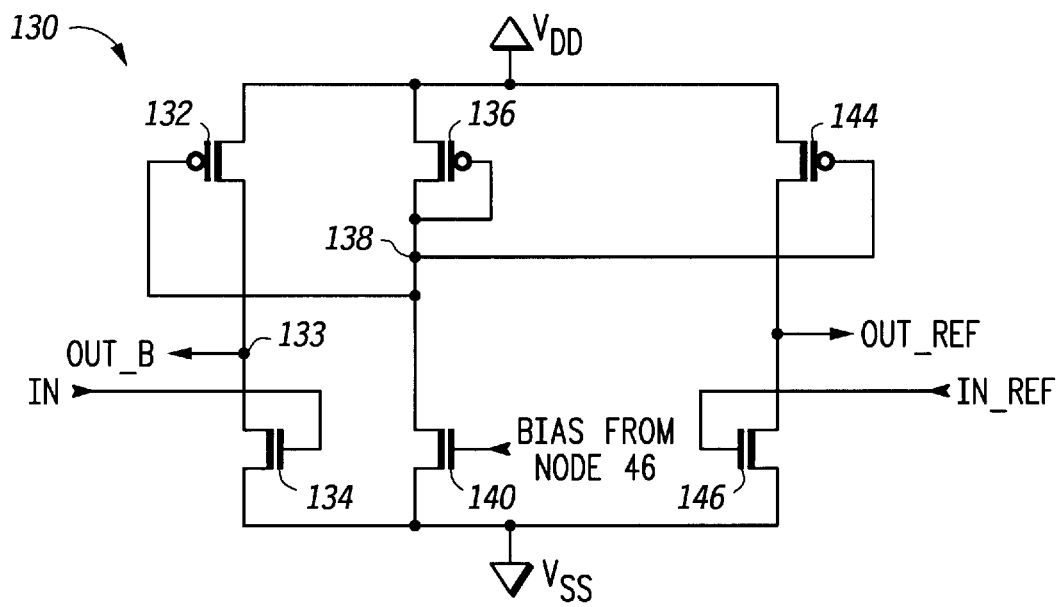
FIG. 10 is a schematic diagram of another gain stage of a sense amplifier for use with any of the illustrated sense amplifiers of FIGS. 2, 4 and 6.

Illustrated in FIG. 10 is a gain stage 130 for use with any of the previously described sense amplifiers in FIGS. 2, 4 or 6. A P-channel transistor 132 has a source connected to a $V_{DD}$ supply voltage terminal. A gate of transistor 132 is connected to a node 138. A drain of transistor 132 provides an output signal OUT_B at a node 133 and is connected to a drain of an N-channel transistor 134. A gate of transistor 134 is connected to an input signal IN. A source of transistor 134 is connected to a $V_{SS}$ supply voltage terminal. A source of a P-channel transistor 136 is connected to the $V_{DD}$ supply voltage terminal. A gate of transistor 136 is connected to a drain thereof at a node 138. The drain of transistor 136 is also connected to a drain of an N-channel transistor 140. A gate of transistor 140 is connected to a bias voltage from node 46 of sense amplifiers 2, 4 or 6. A source of transistor 140 is connected to a $V_{SS}$ supply voltage terminal. A P-channel transistor 144 has a source connected to the $V_{DD}$ supply voltage terminal. A gate of transistor 144 is connected to node 138. A drain of transistor 144 is connected to an output terminal, OUT_REF and to a drain of an N-channel transistor 146. A gate of transistor 146 receives the input signal IN_REF. A source of transistor 146 is connected to the $V_{SS}$ supply voltage terminal.

In operation, the voltage of the IN signal applied to the gate of transistor 134 creates a saturated current level for this transistor that is proportional to $[IN-V_{SS}-V_{thn}]^2$ where $V_{thn}$ is the threshold voltage of an N-channel transistor such as transistor 134. The voltage of the IN_REF signal applied to the gate of transistor 146 creates a saturated current level for this transistor that is proportional to $[IN\_Ref-V_{SS}-V_{thn}]^2$. Transistor 140 is biased by node 46 of FIGS. 2, 4 or 6 in a manner that creates a saturated current level for this transistor that is proportional to $[Node\ 46\ bias-V_{SS}-V_{thn}]^2$. Transistors 140 and 136 function as a bias stage. The current conducted by transistor 140 is mirrored by transistor 136 to create a saturated current level for transistors 132 and 144 equal to $[Node\ 46\ bias-V_{SS}-V_{thn}]^2$. The output at node 133 moves in a direction defined by a difference in the saturated current, $[IN-V_{SS}-V_{thn}]^2$, conducted by transistor 134 and the saturated current, $[Node\ 46\ bias-V_{SS}-V_{thn}]^2$, conducted by transistor 132. Transistors 132 and 134 function as a first output stage and transistors 144 and 146 function as a second output stage. By linking the bias voltage of transistor 140 to a voltage of one of sense amplifiers 2, 4 or 6, the steady state node 46 bias voltage is essentially equal to the steady state voltage IN_REF. Because of the equal bias voltages, the voltage provided at OUT_B will move in a positive direction if the bias voltage IN of transistor 134 is lower than the voltage IN_REF. Similarly, the voltage provided at OUT_B will move in a negative direction if the bias voltage IN of transistor 134 is higher than the voltage IN_REF.

The voltage at the output, OUT_REF, is defined by a difference in the saturated current, $[IN\_REF-V_{SS}-V_{thn}]^2$, conducted by transistor 146 and the saturated current, $[Node\ 46\ bias-V_{SS}-V_{thn}]^2$, conducted by transistor 144. By linking the bias voltage of transistor 140 to a voltage of one of sense amplifiers 2, 4 or 6, the steady state node 46 bias voltage is essentially equal to the steady state voltage IN_REF. Because of the equal bias voltages, the saturated current conducted by transistor 146 is essentially equal to the saturated current conducted by transistor 144 and OUT_REF remains a static voltage reference. While the voltages are transitory in the sense amplifier, the bias voltage from node 46 may not be equal to IN_REF. During this period, nodes OUT_B and OUT_REF will respond in a similar manner to the difference between the voltage of node 46 and the voltage of the IN_REF input. The differential gain is therefore preserved during any time of transitory voltages.

Figure 11:
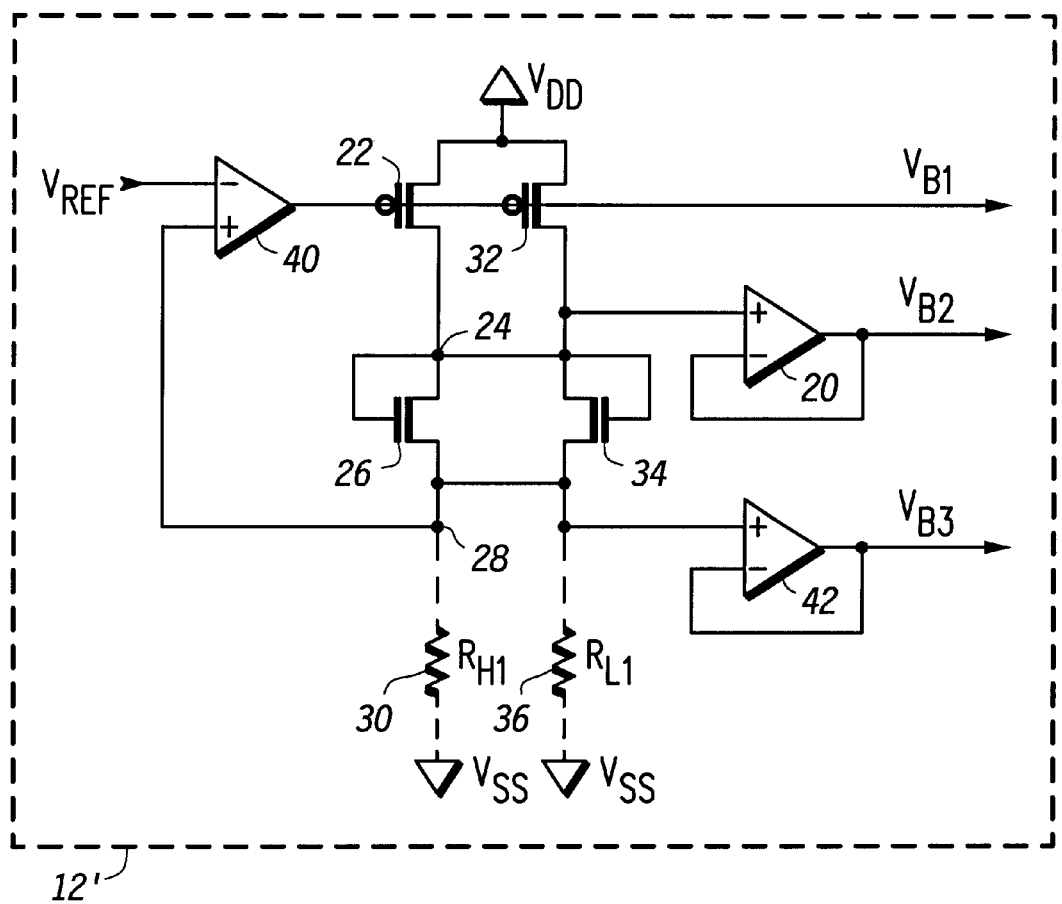
FIG. 11 is a schematic of an alternative bias circuit for use in place of the bias circuit in any of FIGS. 1, 2, 3, 4, 5 or 6.

Illustrated in FIG. 11 is an alternative bias portion 12' for the bias portion 12 illustrated in FIGS. 1, 2, 3, 4, 5 or 6. The voltage bias portion 12' has a P-channel transistor having a first current electrode or source connected to a power supply voltage terminal $V_{DD}$, a control electrode or gate connected to the output of a operational amplifier 40, and a drain connected to a node 24 and to the drain of a N-channel transistor 26. Transistor 26 has a gate connected to the drain thereof and a source connected to a node 28. Operational amplifier 40 has a first or positive (non-inverting) input connected to node 28 and a second or negative (inverting) input connected to a reference voltage $V_{REF}$. A resistor 30 has a first terminal coupled through one or more coupling devices to node 28 and a second terminal coupled through one or more coupling devices to a $V_{SS}$ reference voltage terminal.

Resistor 30 has a value of $R_{H1}$. A P-channel transistor 32 has a source connected to the $V_{DD}$ voltage terminal, a gate connected to the output of operational amplifier 40 and a drain connected to node 24 and to a drain of N-channel transistor 34. Transistor 34 has a gate connected to the drain thereof and a source connected to node 28. A resistor 36 has a first terminal coupled through one or more coupling devices to node 28 and a second terminal coupled through one or more coupling devices to a $V_{SS}$ reference voltage terminal. Resistor 36 has a value of $R_{L1}$. An operational amplifier has a first or positive (non-inverting) input connected to node 24 and a second or negative (inverting) input connected to the output thereof for providing a voltage, $V_{B1}$. An operational amplifier 42 has a first or positive (non-inverting) input connected to node 28 and a second or negative (inverting) input connected to the output thereof for providing a sense precharge voltage, $V_{B3}$. The output of operational amplifier 20 provides a current source gate bias, $V_{B2}$.

Voltage bias portion 12' receives a reference input voltage $V_{REF}$, and uses RH1 and RL1 to provide precharge and bias voltages to sense amplifiers 14, 14', 14", 14''', 14"" and 14''''' in FIGS. 1, 2, 3, 4, 5 and 6 respectively. In operation, $V_{B1}$ is controlled by operational amplifier 40 to maintain a voltage equal to the VRAF input voltage at node 28. Two reference memory cells, $R_{H1}$ and $R_{L1}$ are coupled to node 28. The $R_{H1}$ resistance is a memory cell having a high resistance state and $R_{L1}$ is a memory cell having a low resistance state. The connection of $R_{H1}$ and $R_{L1}$ with the non-inverting input of operational amplifier along with transistors 26 and 34 being sized substantially equal to the size of transistors 52, 62, and 68 in FIGS. 1, 2, 3, 4, 5 and 6 and transistors 22 and 32 being sized substantially equal to the size of transistors 44, 60 and 66 in FIGS. 1, 2, 3, 4, 5 and 6 results in the establishment of a voltage $V_{CB}$ that creates steady state voltages in sense amplifiers 14, 14', 14", 14''', 14"" and 14''''' in FIGS. 1, 2, 3, 4, 5 and 6, respectively, that are substantially equal to the $V_{REF}$ value. In particular, the steady state voltages are the voltages at nodes 54, 64 and 75 in FIGS. 1 and 2 and at nodes 54 and 64 in FIGS. 3, 4, 5, and 6.

Bias portion 12' is designed to adjust the voltages $V_{B1}$, $V_{B2}$, and $V_{B3}$ over temperature, supply voltage, and process variation. The tracking in voltage values between bias portion 12' and sense amplifiers 14, 14', 14", 14''', 14"" and 14''''' in FIGS. 1, 2, 3, 4, 5 and 6, respectively, is in part due to the intentional device size matching of transistors in the voltage bias portion 12' with transistors in sense amplifiers 14, 14', 1499, 14''', 14'''' and 14''''' in FIGS. 1, 2, 3, 4, 5 and 6, respectively, and use of references $R_{H1}$ and $R_{L1}$.

By now it should be apparent that MRAM sense amplifier circuits have been provided that enable fast and efficient read operation of the memory bit cells. A single sense amplifier can develop an average reference current from a reference high bit and a reference low bit with which a differential signal develops in comparison with a bit cell current. Within the sense amplifier, careful distribution of the capacitive load allows for equal capacitive loading on the bit and reference signals, thus optimizing the differential signal. Effective precharge and equalization incorporated into the sense amplifier minimizes the effect of parasitic capacitive imbalances and further improves the speed of operation.

Various changes and modifications to the embodiments herein chosen for purposes of illustration will readily occur to those skilled in the art. These sense amplifier and gain stage improvements are applicable to other memory types whose state is manifested as a change in the resistance value of the bit. Although an MRAM is discussed for some applications, it should be apparent that other types of memory cells may utilize the features disclosed herein. Variations in the types of conductivities of transistors, the types of transistors, etc. may be readily made. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A sense amplifier for sensing a state of a memory cell that is programmable to either a high state or a low state, comprising:
    a first high reference memory cell that is programmed to the high state;
    a first low reference memory cell that is programmed to the low state;
    a first transistor, of a first conductivity type, having a first current electrode coupled to the memory cell, a control electrode for receiving a bias voltage, and a second current electrode for providing an output signal;
    a second transistor, of a second conductivity type, having a first current electrode coupled to the second current electrode of the first transistor, a second current electrode coupled to a first voltage terminal, and a control electrode;
    a third transistor, of the first conductivity type, having a first current electrode coupled to the first high reference memory cell, a control electrode coupled to the control electrode of the first transistor, and a second current electrode;
    a fourth transistor, of the second conductivity type, having a first current electrode coupled to the second current electrode of the third transistor, a control electrode coupled to the first current electrode of the fourth transistor and to the control electrode of the second transistor, and a second current electrode coupled to the first voltage terminal;
    a fifth transistor, of the first conductivity type, having a first current electrode coupled to the first low reference memory cell, a control electrode coupled to the control electrode of the first transistor, and a second current electrode for providing a reference out signal; and
    a sixth transistor, of the second conductivity type, having a first current electrode coupled to the second current electrode of the fifth transistor, a control electrode directly connected to the first current electrode of the sixth transistor and to the control electrode of the fourth transistor, and a second current electrode coupled to the first voltage terminal.

2. The sense amplifier of claim 1, wherein the first conductivity type is N type and the second conductivity type is P type.

3. The sense amplifier of claim 1, further comprising a bias means for providing the bias voltage.

4. The sense amplifier of claim 3, wherein the bias means comprises:
    a second high reference memory cell that is programmed to the high state;
    a second low reference memory cell that is programmed to the low state;
    a seventh transistor, having the first conductivity type, having a first current electrode coupled to the second high reference memory cell, a control electrode, and a second current electrode;
    an operational amplifier having a non-inverting input for receiving a reference voltage, an inverting input coupled to the first current electrode of the seventh transistor, and an output coupled to the control electrode of the seventh transistor;
    an eighth transistor, having the second conductivity type, having a first current electrode coupled to the second current electrode of the seventh transistor, a control electrode coupled to the first current electrode of the eighth transistor, and a second current electrode coupled to the first voltage terminal;
    a ninth transistor, having the first conductivity type, having a first current electrode coupled to the second low reference memory cell and to the first current electrode of the seventh transistor, a control electrode coupled to the output of the operational amplifier, and a second current electrode coupled to the first current electrode of the eighth transistor; and
    a tenth transistor, having the second conductivity type, having a first current electrode coupled to the second current electrode of the ninth transistor, a control electrode coupled to the first current electrode of the tenth transistor, and a second current electrode coupled to the first voltage terminal;
    wherein the first, third, fifth, seventh, and ninth transistors have a first size and the second, fourth, sixth, eighth, and tenth transistors have a second size.

5. The sense amplifier of claim 3, wherein the bias means comprises:
a second high reference memory cell that is programmed to the high state;
a second low reference memory cell that is programmed to the low state;
a seventh transistor, having the first conductivity type, having a first current electrode coupled to the second high reference memory cell, a control electrode, and a second current electrode coupled to the control electrode thereof;
an eighth transistor, having the second conductivity type, having a first current electrode coupled to the second current electrode of the seventh transistor, a control electrode, and a second current electrode coupled to the voltage terminal;
an operational amplifier having an inverting input for receiving a reference voltage, a non-inverting input coupled to the first current electrode of the seventh transistor, and an output coupled to the control electrode of the eighth transistor;
a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and
a tenth transistor, having the second conductivity type, having a first current electrode coupled to the second current electrode of the ninth transistor, a control electrode coupled to the output of the operational amplifier, and a second current electrode coupled to the first voltage terminal;
wherein the first, third, fifth, seventh and ninth transistors have a first size and the second, fourth, sixth, eighth and tenth transistors have a second size.

6. The sense amplifier of claim 1, further comprising:
equalizing means for equalizing a voltage on the second current electrode of the first transistor, the third transistor, and the fifth transistor;
first precharging means for precharging the first current electrode of the first transistor, the third transistor and the fifth transistor; and
second precharging means for precharging the second current electrode of the first transistor, the third transistor, and the fifth transistor.

7. In a sensing system comprising the sense amplifier of claim 1, the sensing system further comprises a gain stage, wherein the gain stage comprises:
a first input stage having an input for receiving the output signal, and an output;
a second input stage having an input for receiving the reference out signal, and an output;
a first output stage having a first input for receiving the output signal, a second input coupled to the output of the second input stage, and an output; and
a second output stage having a first input for receiving the reference out signal, a second input coupled to the output of the first input stage, and an output.

8. In a sensing system comprising the sense amplifier of claim 1, the sensing system further comprising a gain stage, wherein the gain stage comprises:
a bias stage having an input coupled to the first current electrode of the fourth transistor, and an output;
a first output stage having a first input for receiving the output signal, a second input coupled to the output of the bias stage, and an output; and
a second output stage having a first input for receiving the reference out signal, a second input coupled to the output of the bias stage, and an output.

9. A sense amplifier for sensing a state of a memory cell that is programmable to either a high state or a low state, comprising:
a high reference memory cell that is programmed to the high state;
a low reference memory cell that is programmed to the low state;
a first transistor, of a first conductivity type, having a first current electrode coupled to the memory cell, a second current electrode for providing an output signal, and a control electrode;
a second transistor, of a second conductivity type, having a first current electrode coupled to the second current electrode of the first transistor, a second current electrode coupled to a first voltage terminal, and a control electrode for receiving a bias voltage;
a third transistor, of the first conductivity type, having a first current electrode coupled to the high reference memory cell, a control electrode coupled to the control electrode of the first transistor, and a second current electrode coupled to the control electrode of the third transistor;
a fourth transistor, of the second conductivity type, having a first current electrode coupled to the second current electrode of the third transistor, a control electrode for receiving the bias voltage, and a second current electrode coupled to the first voltage terminal;
a fifth transistor, of the first conductivity type, having a first current electrode coupled to the low reference memory cell, a control electrode coupled to the control electrode of the third transistor, and a second current electrode coupled to the control electrode of the fifth transistor and for providing a reference out signal; and
a sixth transistor, of the second conductivity type, having a first current electrode coupled to the second current electrode of the fifth transistor and directly connected to the first current electrode of the fourth transistor, a control electrode for receiving the bias voltage, and a second current electrode coupled to the first voltage terminal.

10. The sense amplifier of claim 9, wherein the first conductivity type is N type and the second conductivity type is P type.

11. The sense amplifier of claim 9, further comprising a bias means for providing the bias voltage.

12. The sense amplifier of claim 11, wherein the bias means comprises:
a second high reference memory cell that is programmed to the high state;
a second low reference memory cell that is programmed to the low state;
a seventh transistor, having the first conductivity type, having a first current electrode coupled to the second high reference memory cell, a control electrode, and a second current electrode;
an operational amplifier having a non-inverting input for receiving a reference voltage, an inverting input coupled to the first current electrode of the seventh transistor, and an output coupled to the control electrode of the seventh transistor;

an eighth transistor, having the second conductivity type, having a first current electrode coupled to the second current electrode of the seventh transistor, a control electrode coupled to the first current electrode of the eighth transistor, and a second current electrode coupled to the voltage terminal;

a ninth transistor, having the first conductivity type, having a first current electrode coupled to the second low reference memory cell and to the first current electrode of the seventh transistor, a control electrode coupled to the output of the operational amplifier, and a second current electrode coupled to the first current electrode of the eighth transistor; and a tenth transistor, having the second conductivity type, having a first current electrode coupled to the second current electrode of the ninth transistor, a control electrode coupled to the first current electrode of the tenth transistor, and a second current electrode coupled to the first voltage terminal;

wherein the first, third, fifth, seventh, and ninth transistors have a first size and the second, fourth, sixth, eighth, and tenth transistors have a second size.

13. The sense amplifier of claim 3, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode coupled to the control electrode thereof;

an eighth transistor, having the second conductivity type, having a first current electrode coupled to the second current electrode of the seventh transistor, a control electrode, and a second current electrode coupled to the voltage terminal;

an operational amplifier having an inverting input for receiving a reference voltage, a non-inverting input coupled to the first current electrode of the seventh transistor, and an output coupled to the control electrode of the eighth transistor;

a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and a tenth transistor, having the second conductivity type, having a first current electrode coupled to the second current electrode of the ninth transistor, a control electrode coupled to the output of the operational amplifier, and a second current electrode coupled to the first voltage terminal;

wherein the first, third, fifth, seventh and ninth transistors have a first size and the second, fourth, sixth, eighth and tenth transistors have a second size.

14. The sense amplifier of claim 9, further comprising:

equalizing means for equalizing a voltage on the second current electrode of each of the first transistor, the third transistor, and the fifth transistor;

first precharging means for precharging the first current electrode of the first transistor, the third transistor and the fifth transistor; and second precharging means for precharging the second current electrode of the first transistor, the third transistor, and the fifth transistor.

15. In a sensing system comprising the sense amplifier of claim 9, the sensing system further comprising a gain stage, wherein the gain stage comprises:

a first input stage having an input for receiving the output signal, and an output;

a second input stage having an input for receiving the reference out signal, and an output;

a first output stage having a first input for receiving the output signal, a second input coupled to the output of the second input stage, and an output; and a second output stage having a first input for receiving the reference out signal, a second input coupled to the output of the first input stage, and an output.

16. In a sensing system comprising the sense amplifier of claim 9, the sensing system further comprising a gain stage, wherein the gain stage comprises:

a bias stage having an input coupled to the first current electrode of the fourth transistor, and an output;

a first output stage having a first input for receiving the output signal, a second input coupled to the output of the bias stage, and an output; and a second output stage having a first input for receiving the reference out signal, a second input coupled to the output of the bias stage, and an output.

17. A sense amplifier for sensing a state of a memory cell that is programmable to either a high state or a low state, comprising:

a high reference memory cell that is programmed to the high state;

a low reference memory cell that is programmed to the low state;

a first transistor, of a first conductivity type, having a first current electrode coupled to the memory cell, a control electrode for receiving a bias voltage, and a second current electrode for providing an output signal;

a second transistor, of a second conductivity type, having a first current electrode coupled to the second current electrode of the first transistor, a second current electrode coupled to a first voltage terminal, and a control electrode;

a third transistor, of the first conductivity type, having a first current electrode coupled to the high reference memory cell and the low reference memory cell, a control electrode for receiving the bias voltage, and a second current electrode;

a fourth transistor, of the second conductivity type, having a first current electrode coupled to the second current electrode of the third transistor, a control electrode coupled to the first current electrode of the fourth transistor and to the control electrode of the second transistor, and a second current electrode coupled to the first voltage terminal;

a fifth transistor, of the first conductivity type, having a first current electrode coupled to the low reference memory cell and the high reference memory cell and directly connected to the first current electrode of the third transistor, a control electrode for receiving the bias voltage, and a second current electrode for providing a reference out signal; and a sixth transistor, of the second conductivity type, having a first current electrode coupled to the second current electrode of the fifth transistor, a control electrode coupled to the control electrode of the fourth transistor, and a second current electrode coupled to the first voltage terminal.

18. The sense amplifier of claim 17, wherein the first conductivity type is N type and the second conductivity type is P type.

19. The sense amplifier of claim 17, further comprising a bias means for providing the bias voltage.

20. The sense amplifier of claim 19, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode;

an operational amplifier having a non-inverting input for receiving a reference voltage, an inverting input coupled to the first current electrode of the seventh transistor, and an output coupled to the control electrode of the seventh transistor;

an eighth transistor, having the second conductivity type, having a first current electrode coupled to the second current electrode of the seventh transistor, a control electrode coupled to the first current electrode of the eighth transistor, and a second current electrode coupled to the first voltage terminal;

a ninth transistor, having the first conductivity type, having a first current electrode coupled to the second low reference memory cell and to the first current electrode of the seventh transistor, a control electrode coupled to the output of the operational amplifier, and a second current electrode coupled to the first current electrode of the eighth transistor; and a tenth transistor, having the second conductivity type, having a first current electrode coupled to the second current electrode of the ninth transistor, a control electrode coupled to the first current electrode of the tenth transistor, and a second current electrode coupled to the first voltage terminal;

wherein the first, third, fifth, seventh, and ninth transistors have a first size and the second, fourth, sixth, eighth, and tenth transistors have a second size.

21. The sense amplifier of claim 19, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode coupled to the control electrode thereof;

an eighth transistor, having the second conductivity type, having a first current electrode coupled to the second current electrode of the seventh transistor, a control electrode, and a second current electrode coupled to the voltage terminal;

an operational amplifier having an inverting input for receiving a reference voltage, a non-inverting input coupled to the first current electrode of the seventh transistor, and an output coupled to the control electrode of the eighth transistor;

a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and a tenth transistor, having the second conductivity type, having a first current electrode coupled to the second current electrode of the ninth transistor, a control electrode coupled to the output of the operational amplifier, and a second current electrode coupled to the first voltage terminal;

wherein the first, third, fifth, seventh and ninth transistors have a first size and the second, fourth, sixth, eighth and tenth transistors have a second size.

22. The sense amplifier of claim 15, further comprising:

equalizing means for equalizing a voltage on the second current electrode of each of the first, third and fifth transistors;

first precharging means for precharging the first current electrode of the first transistor, the third transistor and the fifth transistor; and second precharging means for precharging the second current electrode of the first transistor, the third transistor and the fifth transistor.

23. In a sensing system comprising the sense amplifier of claim 17, the sensing system further comprising a gain stage, wherein the gain stage comprises:

a first input stage having an input for receiving the output signal, and an output;

a second input stage having an input for receiving the reference out signal, and an output;

a first output stage having a first input for receiving the output signal, a second input coupled to the output of the second input stage, and an output; and a second output stage having a first input for receiving the reference out signal, a second input coupled to the output of the first input stage, and an output.

24. In a sensing system comprising the sense amplifier of claim 17, the sensing system further comprising a gain stage, wherein the gain stage comprises:

a bias stage having an input coupled to the first current electrode of the fourth transistor, and an output;

a first output stage having a first input for receiving the output signal, a second input coupled to the output of the bias stage, and an output; and a second output stage having a first input for receiving the reference out signal, a second input coupled to the output of the bias stage, and an output.

25. A sense amplifier for sensing a state of a memory cell that is programmable to either a high state or a low state, comprising:

a high reference memory cell that is programmed to the high state;

a low reference memory cell that is programmed to the low state;

a first transistor, of a first conductivity type, having a first current electrode coupled to the memory cell, a second current electrode for providing an output signal, and a control electrode;

a second transistor, of a second conductivity type, having a first current electrode coupled to the second current electrode of the first transistor, a second current electrode coupled to a first voltage terminal, and a control electrode for receiving a bias voltage;

a third transistor, of the first conductivity type, having a first current electrode coupled to the low reference memory cell and the high reference memory cell, a control electrode coupled to the control electrode of the first transistor, and a second current electrode coupled to the control electrode of the third transistor;

a fourth transistor, of the second conductivity type, having a first current electrode coupled to the second current electrode of the third transistor, a control electrode for receiving the bias voltage, and a second current electrode coupled to the first voltage terminal;

a fifth transistor, of the first conductivity type, having a first current electrode coupled to the high reference memory cell and the low reference memory cell and directly connected to the first current electrode of the third transistor, a control electrode coupled to the control electrode of the third transistor, and a second current electrode for providing a reference out signal; and a sixth transistor, of the second conductivity type, having a first current electrode coupled to the second current electrode of the fifth transistor, a control electrode for receiving the bias voltage, and a second current electrode coupled to the first voltage terminal.

26. The sense amplifier of claim 25, wherein the first conductivity type is N type and the second conductivity type is P type.

27. The sense amplifier of claim 25, further comprising a bias means for providing the bias voltage.

28. The sense amplifier of claim 27, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode;

an operational amplifier having a non-inverting input for receiving a reference voltage, an inverting input coupled to the first current electrode of the seventh transistor, and an output coupled to the control electrode of the seventh transistor;

an eighth transistor, having the second conductivity type, having.a first current electrode coupled to the second current electrode of the seventh transistor, a control electrode coupled to the first current electrode of the eighth transistor, and a second current electrode coupled to the first voltage terminal;

a ninth transistor, having the first conductivity type, having a first current electrode coupled to the second low reference memory cell and to the first current electrode of the seventh transistor, a control electrode coupled to the output of the operational amplifier, and a second current electrode coupled to the second current electrode of the eighth transistor; and a tenth transistor, having the second conductivity type, having a first current electrode coupled to the second current electrode of the ninth transistor, a control electrode coupled to the first current electrode of the tenth transistor, and a second current electrode coupled to the first voltage terminal;

wherein the first, third, fifth, seventh, and ninth transistors have a first size and the second, fourth, sixth, eighth, and tenth transistors have a second size.

29. The sense amplifier of claim 27, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode coupled to the control electrode thereof;

an eighth transistor, having the second conductivity type, having a first current electrode coupled to the second current electrode of the seventh transistor, a control electrode, and a second current electrode coupled to the voltage terminal;

an operational amplifier having an inverting input for receiving a reference voltage, a non-inverting input coupled to the first current electrode of the seventh transistor, and an output coupled to the control electrode of the eighth transistor;

a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and a tenth transistor, having the second conductivity type, having a first current electrode coupled to the second current electrode of the ninth transistor, a control electrode coupled to the output of the operational amplifier, and a second current electrode coupled to the first voltage terminal;

wherein the first, third, fifth, seventh and ninth transistors have a first size and the second, fourth, sixth, eighth and tenth transistors have a second size.

30. The sense amplifier of claim 25, further comprising:

equalizing means for equalizing a voltage on the second current electrode of each of the first transistor, the third transistor and the fifth transistor;

first precharging means for precharging the first current electrode of the first transistor, the third transistor and the fifth transistor; and second precharging means for precharging the second current electrode of the first transistor, the third transistor and the fifth transistor.

31. In a sensing system comprising the sense amplifier of claim 25, the sensing system further comprising a gain stage, wherein the gain stage comprises:

a first input stage having an input for receiving the output signal, and an output;

a second input stage having an input for receiving the reference out signal, and an output;

a first output stage having a first input for receiving the output signal, a second input coupled to the output of the second input stage, and an output; and a second output stage having a first input for receiving the reference out signal, a second input coupled to the output of the first input stage, and an output.

32. In a sensing system comprising the sense amplifier of claim 25, the sensing system further comprising a gain stage, wherein the gain stage comprises:

a bias stage having an input coupled to the first current electrode of the fourth transistor, and an output;

a first output stage having a first input for receiving the output signal, a second input coupled to the output of the bias stage, and an output; and a second output stage having a first input for receiving the reference out signal, a second input coupled to the output of the bias stage, and an output.

33. A sense amplifier for sensing a state of a memory cell that is programmable to either a high state or a low state, comprising:

a high reference memory cell that is programmed to the high state;

a low reference memory cell that is programmed to the low state;

a first transistor, of a first conductivity type, having a first current electrode coupled to the memory cell, a control electrode for receiving a bias voltage, and a second current electrode for providing an output signal;

a second transistor, of a second conductivity type, having a first current electrode coupled to the second current electrode of the first transistor, a second current electrode coupled to a first voltage terminal, and a control electrode;

a third transistor, of the first conductivity type, having a first current electrode coupled to the low reference memory cell and the high reference memory cell, a control electrode for receiving the bias voltage, and a second current electrode;

a fourth transistor, of the second conductivity type, having a first current electrode coupled to the second current electrode of the third transistor, a control electrode coupled to the first current electrode thereof, and a second current electrode coupled to the first voltage terminal;

a fifth transistor, of the first conductivity type, having a first current electrode coupled to the low reference memory cell and the high reference memory cell and directly connected to the first current electrode of the third transistor, a control electrode for receiving the bias voltage, and a second current electrode for providing a reference out signal; and a sixth transistor, of the second conductivity type, having a first current electrode coupled to the second current electrode of the fifth transistor and the control electrode of the second transistor, a control electrode coupled to the first current electrode of the second transistor, and a second current electrode coupled to the first voltage terminal.

34. The sense amplifier of claim 33, wherein the first conductivity type is N type and the second conductivity type is P type.

35. The sense amplifier of claim 33, further comprising a bias means for providing the bias voltage.

36. The sense amplifier of claim 35, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode;

an operational amplifier having a non-inverting input for receiving a reference voltage, an inverting input coupled to the first current electrode of the seventh transistor, and an output coupled to the control electrode of the seventh transistor;

an eighth transistor, having the second conductivity type, having a first current electrode coupled to the second current electrode of the seventh transistor, a control electrode coupled to the first current electrode of the eighth transistor, and a second current electrode coupled to the first voltage terminal;

a ninth transistor, having the first conductivity type, having a first current electrode coupled to the second low reference memory cell and to the first current electrode of the seventh transistor, a control electrode coupled to the output of the operational amplifier, and a second current electrode coupled to the first current electrode of the eighth transistor; and a tenth transistor, having the second conductivity type, having a first current electrode coupled to the second current electrode of the ninth transistor, a control electrode coupled to the first current electrode of the tenth transistor, and a second current electrode coupled to the first voltage terminal;

wherein the first, third, fifth, seventh, and ninth transistors have a first size and the second,.fourth, sixth, eighth, and tenth transistors have a second size.

37. The sense amplifier of claim 35, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode coupled to the control electrode thereof;

an eighth transistor, having the second conductivity type, having a first current electrode coupled to the second current electrode of the seventh transistor, a control electrode, and a second current electrode coupled to the voltage terminal;

an operational amplifier having an inverting input for receiving a reference voltage, a non-inverting input coupled to the first current electrode of the seventh transistor, and an output coupled to the control electrode of the eighth transistor;

a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and a tenth transistor, having the second conductivity type, having a first current electrode coupled to the second current electrode of the ninth transistor, a control electrode coupled to the output of the operational amplifier, and a second current electrode coupled to the first voltage terminal;

wherein the first, third, fifth, seventh and ninth transistors have a first size and the second, fourth, sixth, eighth and tenth transistors have a second size.

38. The sense amplifier of claim 33, further comprising:

equalizing means for equalizing a voltage on the second current electrode of each of the first transistor, the third transistor and the fifth transistor;

first precharging means for precharging the first current electrode of the first transistor, the third transistor and the fifth transistor; and second precharging means for precharging the second current electrode of the first transistor, the third transistor and the fifth transistor.

39. In a sensing system comprising the sense amplifier of claim 33, the sensing system further comprising a gain stage, wherein the gain stage comprises:

a first input stage having an input for receiving the output signal, and an output;

a second input stage having an input for receiving the reference out signal, and an output;

a first output stage having a first input for receiving the output signal, a second input coupled to the output of the second input stage, and an output; and a second output stage having a first input for receiving the reference out signal, a second input coupled to the output of the first input stage, and an output.

40. In a sensing system comprising the sense amplifier of claim 33, the sensing system further comprising a gain stage, wherein the gain stage comprises:

a bias stage having an input coupled to the first current electrode of the fourth transistor, and an output;

a first output stage having a first input for receiving the output signal, a second input coupled to the output of the bias stage, and an output; and a second output stage having a first input for receiving the reference out signal, a second input coupled to the output of the bias stage, and an output.

41. A sense amplifier for sensing a state of a memory cell that is programmable to either a high state or a low state, comprising:

a high reference memory cell that is programmed to the high state;

a low reference memory cell that is programmed to the low state;

a first transistor, of a first conductivity type, having a first current electrode coupled to the memory cell, a second current electrode for providing an output signal, and a control electrode;

a second transistor, of a second conductivity type, having a first current electrode coupled to the second current electrode of the first transistor, a second current electrode coupled to a first voltage terminal, and a control electrode for receiving a bias voltage;

a third transistor, of the first conductivity type, having a first current electrode coupled to the low reference memory cell and the high reference memory cell, a control electrode, and a second current electrode coupled to the control electrode of the third transistor;

a fourth transistor, of the second conductivity type, having a first current electrode coupled to the second current electrode of the third transistor, a control electrode for receiving the bias voltage, and a second current electrode coupled to the first voltage terminal;

a fifth transistor, of the first conductivity type, having a first current electrode coupled to the low reference memory cell and the high reference memory cell and directly connected to the first current electrode of the third transistor, a control electrode coupled to the second current electrode of the first transistor, and a second current electrode for providing a reference out signal and coupled to the control electrode of the first transistor; and a sixth transistor, of the second conductivity type, having a first current electrode coupled to the second current electrode of the fifth transistor, a control electrode for receiving the bias voltage, and a second current electrode coupled to the first voltage terminal.

42. The sense amplifier of claim 41, wherein the first conductivity type is N type and the second conductivity type is P type.

43. The sense amplifier of claim 41, further comprising a bias means for providing the bias voltage.

44. The sense amplifier of claim 43, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode;

an operational amplifier having a non-inverting input for receiving a reference voltage, an inverting input coupled to the first current electrode of the seventh transistor, and an output coupled to the control electrode of the seventh transistor;

an eighth transistor, having the second conductivity type, having a first current electrode coupled to the second current electrode of the seventh transistor, a control electrode coupled to the first current electrode of the eighth transistor, and a second current electrode coupled to the voltage terminal;

a ninth transistor, having the first conductivity type, having a first current electrode coupled to the second low reference memory cell and to the first current electrode of the seventh transistor, a control electrode coupled to the output of the operational amplifier, and a second current electrode coupled to the first current electrode of the eighth transistor; and a tenth transistor, having the second conductivity type, having a first current electrode coupled to the second current electrode of the ninth transistor, a control electrode coupled to the first current electrode of the tenth transistor, and a second current electrode coupled to the first voltage terminal;

wherein the first, third, fifth, seventh, and ninth transistors have a first size and the second, fourth, sixth, eighth and tenth transistors have a second size.

45. The sense amplifier of claim 43, wherein the bias means comprises:

a second high reference memory cell that is programmed to the high state;

a second low reference memory cell that is programmed to the low state;

a seventh transistor, having the first conductivity type, having a first current electrode coupled to the second high reference memory cell, a control electrode, and a second current electrode coupled to the control electrode thereof;

an eighth transistor, having the second conductivity type, having a first current electrode coupled to the second current electrode of the seventh transistor, a control electrode, and a second current electrode coupled to the voltage terminal;

an operational amplifier having an inverting input for receiving a reference voltage, a non-inverting input coupled to the first current electrode of the seventh transistor, and an output coupled to the control electrode of the eighth transistor;

a ninth transistor, having the first conductivity type, having a first current electrode coupled to the second low reference memory cell and to the first current electrode of the seventh transistor, a control electrode coupled to the control electrode of the seventh transistor, and a second current electrode coupled to the first current electrode of the eighth transistor; and a tenth transistor, having the second conductivity type, having a first current electrode coupled to the second current electrode of the ninth transistor, a control electrode coupled to the output of the operational amplifier, and a second current electrode coupled to the first voltage terminal;

wherein the first, third, fifth, seventh and ninth transistors have a first size and the second, fourth, sixth, eighth and tenth transistors have a second size.

46. The sense amplifier of claim 41, further comprising:

equalizing means for equalizing a voltage on the second current electrode of each of the first transistor, the third transistor, and the fifth transistor;

first precharging means for precharging the first current electrode of the first transistor, the third transistor and the fifth transistor; and second precharging means for precharging the second current electrode of the first transistor, the third transistor, and the fifth transistor.

47. In a sensing system comprising the sense amplifier of claim 41, the sensing system further comprising a gain stage, wherein the gain stage comprises:

a first input stage having an input for receiving the output signal, and an output;

a second input stage having an input for receiving the reference out signal, and an output;

a first output stage having a first input for receiving the output signal, a second input coupled to the output of the second input stage, and an output; and a second output stage having a first input for receiving the reference out signal, a second input coupled to the output of the first input stage, and an output.

48. In a sensing system comprising the sense amplifier of claim 41, the sensing system further comprising a gain stage, wherein the gain stage comprises:

a bias stage having an input coupled to the first current electrode of the fourth transistor, and an output;

a first output stage having a first input for receiving the output signal, a second input coupled to the output of the bias stage, and an output; and a second output stage having a first input for receiving the reference out signal, a second input coupled to the output of the bias stage, and an output.

49. A sense amplifier comprising:

a memory cell that is programmable to either a high state or a low state;

a reference memory cell that is programmable to one of the high state or the low state to provide a reference input;

a first transistor, of a first conductivity type, having a first current electrode coupled to the memory cell, a second current electrode for providing an output signal, and a control electrode, all current conducted by the first transistor being directed through the memory cell;

a second transistor, of a second conductivity type, having a first current electrode coupled to the second current electrode of the first transistor, a second current electrode coupled to a first voltage terminal, and a control electrode for receiving a bias voltage;

a third transistor, of the first conductivity type, having a first current electrode coupled to the reference memory cell, a control electrode coupled to the control electrode of the first transistor, and a second current electrode, all current conducted by the third transistor being directed through the reference memory cell; and a fourth transistor, of the second conductivity type, having a first current electrode coupled to the second current electrode of the third transistor, a control electrode for receiving the bias voltage, and a second current electrode coupled to the first voltage terminal.

* * * * *